US012559301B2

(12) United States Patent
Shimizu et al.

(10) Patent No.: US 12,559,301 B2
(45) Date of Patent: Feb. 24, 2026

(54) MEMBER, CONTAINER, CHEMICAL LIQUID STORAGE BODY, REACTOR, DISTILLATION COLUMN, FILTER UNIT, STORAGE TANK, PIPE LINE, AND CHEMICAL LIQUID MANUFACTURING METHOD

(71) Applicant: FUJIFILM Corporation, Tokyo (JP)

(72) Inventors: Tetsuya Shimizu, Haibara-gun (JP); Tetsuya Kamimura, Haibara-gun (JP); Satomi Takahashi, Haibara-gun (JP); Tadashi Oomatsu, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 801 days.

(21) Appl. No.: 17/141,335

(22) Filed: Jan. 5, 2021

(65) Prior Publication Data

US 2021/0130084 A1 May 6, 2021

Related U.S. Application Data

(63) Continuation of application No. PCT/JP2019/026826, filed on Jul. 5, 2019.

(30) Foreign Application Priority Data

Jul. 6, 2018 (JP) ................................ 2018-129395

(51) Int. Cl.

*B65D 85/84* (2006.01)
*B01D 3/00* (2006.01)

(Continued)

(52) U.S. Cl.

CPC ............... *B65D 85/84* (2013.01); *B01D 3/00* (2013.01); *B01D 39/2027* (2013.01);

(Continued)

(58) Field of Classification Search

None

See application file for complete search history.

(56) References Cited

U.S. PATENT DOCUMENTS 5,538,754 A * 7/1996 Sandock ............. H05K 3/0091 118/410
5,952,429 A * 9/1999 Ikeda .................... G03G 9/122 525/327.4

(Continued)

FOREIGN PATENT DOCUMENTS

CN 103154292 A 6/2013
CN 108136756 A 6/2018

(Continued)

OTHER PUBLICATIONS

Korean Office Action dated Dec. 20, 2022 in Korean Application No. 10-2021-7000191.

(Continued)

*Primary Examiner* — Richard C Gurtowski
(74) *Attorney, Agent, or Firm* — Sughrue Mion, PLLC

(57) ABSTRACT

The present invention provides a member which makes is possible to obtain excellent residue defect inhibition properties and excellent bridge defect inhibition properties of a chemical liquid in a case where the member is brought into contact with the chemical liquid. The present invention also provides a container, a chemical liquid storage body, a reactor, a distillation column, a filter unit, a storage tank, a pipe line, and a chemical liquid manufacturing method. The member according to an embodiment of the present invention is a member that will be brought into contact with a chemical liquid. A surface of the member is constituted with stainless steel containing chromium atoms and iron atoms. In a case where an atomic ratio of the chromium atoms to the iron atoms is measured from the surface of the member to a position 10 nm below the surface in a depth direction, a (Continued)

maximum value of the atomic ratio is found in a region extending 3 nm from the surface of the member in the depth direction. The maximum value is 0.5 to 3.0, and an average surface roughness of the surface of the member is equal to or lower than 10 nm.

13 Claims, 7 Drawing Sheets

(51) Int. Cl.

| | |
|---|---|
| ***B01D 39/20*** | (2006.01) |
| ***B65D 25/14*** | (2006.01) |
| ***C11D 7/50*** | (2006.01) |
| ***C25F 3/24*** | (2006.01) |
| *H01L 21/02* | (2006.01) |

(52) U.S. Cl.

CPC ............ *B65D 25/14* (2013.01); *C11D 7/5004* (2013.01); *C25F 3/24* (2013.01); *H01L 21/02057* (2013.01)

(56) References Cited

U.S. PATENT DOCUMENTS

| | | | | |
|---|---|---|---|---|
| 2002/0037120 | A1 | 3/2002 | Tanaka et al. | |
| 2006/0169669 | A1 * | 8/2006 | Zojaji | B08B 7/0035 216/37 |
| 2007/0100010 | A1 * | 5/2007 | Creazzo | C08J 9/144 521/98 |
| 2013/0193164 | A1 | 8/2013 | Tom et al. | |
| 2013/0316262 | A1 | 11/2013 | Ishii et al. | |
| 2018/0222164 | A1 | 8/2018 | Iwai et al. | |
| 2018/0291523 | A1 * | 10/2018 | Korinko | C25F 3/24 |
| 2019/0025703 | A1 | 1/2019 | Shimizu et al. | |
| 2019/0171102 | A1 | 6/2019 | Kamimura et al. | |
| 2019/0219924 | A1 | 7/2019 | Kamimura | |
| 2019/0243240 | A1 | 8/2019 | Kamimura et al. | |
| 2021/0001303 | A1 * | 1/2021 | Sera | C23C 22/74 |
| 2022/0308449 | A1 * | 9/2022 | Tsuchihashi | G03F 7/32 |

FOREIGN PATENT DOCUMENTS

| | | | |
|---|---|---|---|
| EP | 0596121 | A1 | 5/1994 |
| JP | 2004-233254 | A | 8/2004 |
| JP | 2007-071580 | A | 3/2007 |
| JP | 2008-264929 | A | 11/2008 |
| JP | 2010-018779 | A | 1/2010 |
| JP | 2012-149309 | A | 8/2012 |
| JP | 2015227501 | A | 12/2015 |
| TW | 201706190 | A | 2/2017 |
| TW | 201816083 | A | 5/2018 |
| WO | 2017169832 | A1 | 10/2017 |
| WO | 2018043690 | A1 | 3/2018 |
| WO | 2018/061485 | A1 | 4/2018 |
| WO | 2018092763 | A1 | 5/2018 |

OTHER PUBLICATIONS

International Search Report dated Aug. 20, 2019 from the International Searching Authority in International Application No. PCT/JP2019/026826.

International Preliminary Report on Patentability dated Jan. 12, 2021 from the International Bureau in International Application No. PCT/JP2019/026826.

Written Opinion dated Aug. 20, 2019 from the International Bureau in International Application No. PCT/JP2019/026826.

Korean Office Action dated Jun. 15, 2023 in Korean Application No. 10-2021-7000191.

Office Action dated Jan. 16, 2023 from Taiwan Patent Office in Application No. 108123789.

Office Action dated Feb. 11, 2023 from the Chinese Patent Office in Application No. 201980045368.0.

* cited by examiner

MEMBER, CONTAINER, CHEMICAL LIQUID STORAGE BODY, REACTOR, DISTILLATION COLUMN, FILTER UNIT, STORAGE TANK, PIPE LINE, AND CHEMICAL LIQUID MANUFACTURING METHOD

CROSS-REFERENCE TO RELATED APPLICATIONS

This application is a Continuation of PCT International Application No. PCT/JP2019/026826 filed on Jul. 5, 2019, which claims priority under 35 U.S.C. § 119(a) to Japanese Patent Application No. 2018-129395 filed on Jul. 6, 2018. Each of the above applications is hereby expressly incorporated by reference, in its entirety, into the present application.

BACKGROUND OF THE INVENTION

1. Field of the Invention

The present invention relates to a member, a container, a chemical liquid storage body, a reactor, a distillation column, a filter unit, a storage tank, a pipe line, and a chemical liquid manufacturing method.

2. Description of the Related Art

The semiconductor manufacturing process includes various steps such as a lithography step, an etching step, an ion implantation step, and a peeling step. Generally, the semiconductor manufacturing process includes a treatment step using a chemical liquid that is performed after each step ends or before the process moves on the next step.

In the semiconductor manufacturing process, defects occur due to a trace of foreign substances and the like. Therefore, the chemical liquid is required to have characteristics such as high purity and high cleanliness in many cases. For example, it is known that a trace of impurities such as metal components contained in chemical liquids such as a prewet solution, a developer, and a rinsing solution used in the photolithography process greatly affect the performance of a formed pattern.

The use of a fluororesin material in a liquid contact portion further reduces the content of metal component impurities. However, in a case where a solvent having a high volume resistivity is handled, static electricity is generated due to streaming electrification or the like. Particularly, at a voltage higher than 2 kV, depending on the handling method, the risk such as the damage of a liquid contact member and/or the contamination of the liquid resulting from electric discharge occurs.

JP2004-233254A discloses a high-purity chemical supply device capable of keeping the particle amount in a high-purity chemical at an extremely low level. The supply device includes a container body with electropolished inner surface made of stainless steel.

SUMMARY OF THE INVENTION

The inventors of the present invention have studied the chemical liquid stored in the container disclosed in JP2004-233254A. As a result, the inventors have found that the residue defect inhibition properties and bridge defect inhibition properties of the chemical liquid after storage need to be further improved.

An object of the present invention is to provide a member that makes it possible to obtain excellent residue defect inhibition properties and excellent bridge defect inhibition properties of a chemical liquid in a case where the member is brought into contact with the chemical liquid.

Another object of the present invention is to provide a container, a chemical liquid storage body, a reactor, a distillation column, a filter unit, a storage tank, a pipe line, and a chemical liquid manufacturing method.

In order to achieve the above objects, the inventors of the present invention conducted intensive studies. As a result, the inventors have found that the objects can be achieved by the following constitutions.

[1] A member that will be brought into contact with a chemical liquid, in which a surface of the member is constituted with stainless steel containing chromium atoms and iron atoms, in a case where an atomic ratio of the chromium atoms to the iron atoms is measured from the surface of the member to a position 10 nm below the surface along a depth direction, a maximum value of the atomic ratio is found in a region extending 3 nm from the surface in the depth direction, the maximum value is 0.5 to 3.0, and an average surface roughness of the surface of the member is equal to or lower than 10 nm.

[2] The member described in [1], in which the average surface roughness is 0.10 to 10 nm.

[3] The member described in [1] or [2], in which the atomic ratio of the chromium atoms to the iron atoms within the surface of the member is 1.1 to 2.5.

[4] The member described in any one of [1] to [3], in which the surface of the member is subjected to electropolishing.

[5] The member described in [4], in which the surface of the member is subjected to a surface treatment other than the electropolishing before the electropolishing.

[6] The member described in [4] or [5], in which the surface of the member is further subjected to an acid treatment after the electropolishing.

[7] The member described in any one of [1] to [6] that is used for at least one kind of purpose selected from the group consisting of manufacturing, storage, transport, and transfer of a chemical liquid for manufacturing semiconductors.

[8] The member described in [7], in which the chemical liquid has a volume resistivity equal to or higher than 500,000,000 Ωm.

[9] A container for storing a chemical liquid, in which at least a part of a liquid contact portion of the container is formed of the member described in any one of [1] to [8].

[10] A chemical liquid storage body including the container described in [8] and a chemical liquid stored in the container.

[11] The chemical liquid storage body described in [10], in which the chemical liquid is a mixed solvent containing 20% to 80% by mass of an organic solvent having a Hansen solubility parameter distance of 3 to 20 $MPa^{0.5}$ to eicosene with respect to a total mass of the chemical liquid and 20% to 80% by mass of an organic solvent having a Hansen solubility parameter distance not being in a range of 3 to 20 $MPa^{0.5}$ to eicosene with respect to a total mass of the chemical liquid.

[12] The chemical liquid storage body described in [10], in which the chemical liquid contains one or more kinds of compounds selected from the group consisting of propylene glycol monomethyl ether acetate, propylene glycol monomethyl ether, butyl acetate, cyclohexanone, 4-methyl-2-pentanol, isopropanol, ethanol, acetone, propylene carbonate, γ-butyrolactone, isoamyl acetate, propylene glycol monoethyl ether, propylene glycol monopropyl ether, ethyl lactate, methyl methoxypropionate, cyclopentanone, diisoamyl ether, dimethyl sulfoxide, N-methylpyrrolidone, diethylene glycol, ethylene glycol, dipropylene glycol, propylene glycol, ethylene carbonate, sulfolane, cycloheptanone, 2-heptanone, butyl butyrate, isobutyl isobutyrate, undecane, pentyl propionate, isopentyl propionate, ethylcyclohexane, mesitylene, decane, 3,7-dimethyl-3-octanol, 2-ethyl-1-hexanol, 1-octanol, 2-octanol, ethyl acetoacetate, dimethyl malonate, methyl pyruvate, and dimethyl oxalate.

[13] The chemical liquid storage body described in any one of [10] to [12], in which the chemical liquid has a volume resistivity equal to or higher than 500,000,000 Ωm.

[14] The chemical liquid storage body described in [10], in which the chemical liquid is an alkaline developer.

[15] The chemical liquid storage body described in any one of [10] to [14], in which the chemical liquid contains 0.1 to 100,000 mass ppt of an organic component having a boiling point equal to or higher than 250° C. with respect to a mass of the chemical liquid.

[16] The chemical liquid storage body described in any one of [10] to [15], in which a void portion in the container is filled with an inert gas.

[17] A reactor for obtaining a chemical liquid as a reactant by reacting raw materials, in which at least a part of a liquid contact portion of the reactor is formed of the member described in any one of [1] to [8].

[18] A distillation column for obtaining a chemical liquid as a purified substance by purifying a substance to be purified, in which at least a part of a liquid contact portion of the distillation column is formed of the member described in any one of [1] to [8].

[19] A filter unit for obtaining a chemical liquid as a purified substance by purifying a substance to be purified, in which at least a part of a liquid contact portion of the filter unit is formed of the member described in any one of [1] to [8].

[20] A storage tank for storing raw materials for obtaining a chemical liquid as a reactant by being reacted or storing a substance to be purified for obtaining a chemical liquid as a purified substance by being purified, in which at least a part of a liquid contact portion of the storage tank is formed of the member described in any one of [1] to [8].

[21] A pipe line for transferring the chemical liquid, in which at least a part of a liquid contact portion of the pipe line is formed of the member described in any one of [1] to [8].

[22] A chemical liquid manufacturing method, in which a chemical liquid is manufactured using a chemical liquid manufacturing device comprising at least one kind of unit selected from the group consisting of the reactor described in [17], the distillation column described in [18], the filter unit described in [19], the storage tank described in [20], and the pipe line described in [21].

[23] The chemical liquid manufacturing method described in [22], in which the chemical liquid contains an organic solvent, and the organic solvent contains one or more kinds of compounds selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, isoamyl acetate, isopropanol, 4-methyl-2-pentanol, dimethyl sulfoxide, n-methyl-2-pyrrolidone, diethylene glycol, ethylene glycol, dipropylene glycol, propylene glycol, ethylene carbonate, propylene carbonate, sulpholane, cycloheptanone and 2-heptanone, butyl butyrate, isobutyl isobutyrate, undecane, pentyl propionate, isopentyl propionate, ethylcyclohexane, mesitylene, decane, 3,7-dimethyl-3-octanol, 2-ethyl-1-hexanol, 1-octanol, 2-octanol, ethyl acetoacetate, dimethyl malonate, methyl pyruvate, and dimethyl oxalate.

[24] The chemical liquid manufacturing method described in [23], in which the chemical liquid has a volume resistivity equal to or higher than 500,000,000 Ωm.

[25] The chemical liquid manufacturing method described in [22], in which the chemical liquid is an alkaline developer.

According to an aspect of the present invention, it is possible to provide a member that makes it possible to obtain excellent residue defect inhibition properties and excellent bridge defect inhibition properties of a chemical liquid in a case where the member is brought into contact with the chemical liquid.

Furthermore, according to an aspect of the present invention, it is possible to provide a container, a chemical liquid storage body, a reactor, a distillation column, a filter unit, a storage tank, a pipe line, and a chemical liquid manufacturing method.

DESCRIPTION OF THE PREFERRED EMBODIMENTS

Figure 1:
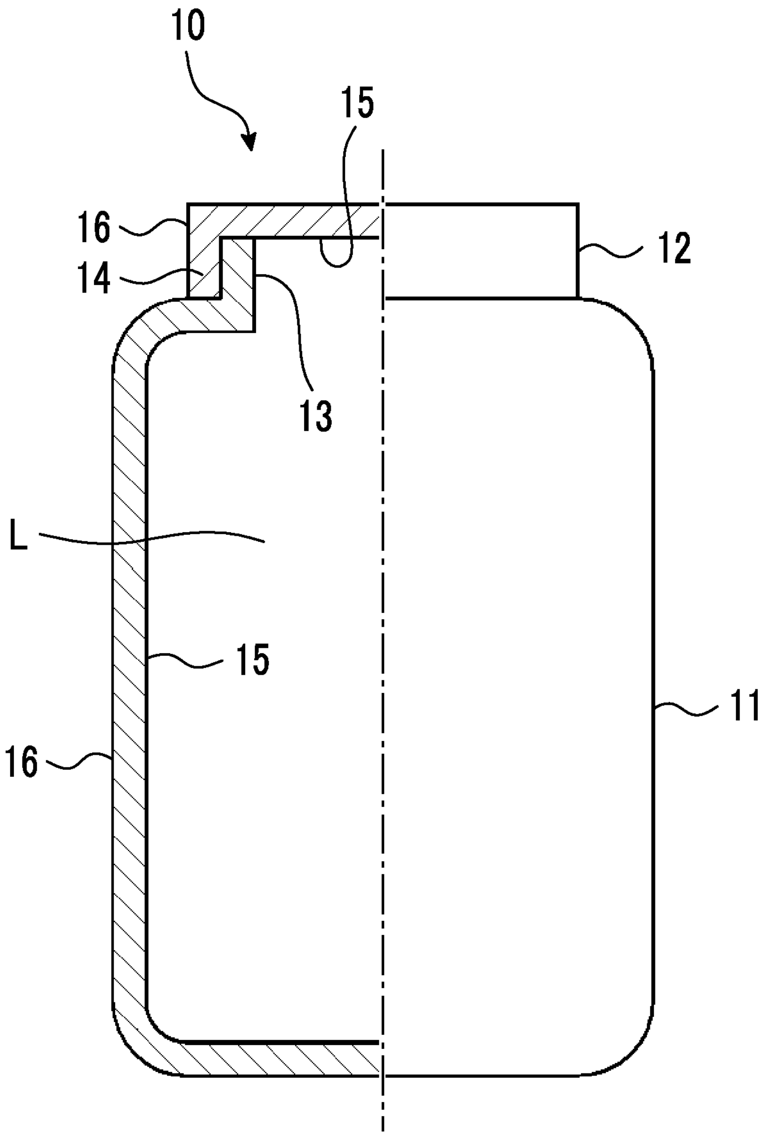
FIG. 1 is a schematic view of a container with a lid including a container according to an embodiment of the present invention and a lid.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

Furthermore, in the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, regarding the description of a group (atomic group), in a case where whether the group is substituted or unsubstituted is not described, as long as the effects of the present invention are not impaired, the group includes a group which does not contain a substituent and a group which contains a substituent. For example, "hydrocarbon group" includes not only a hydrocarbon group which does not contain a substituent (unsubstituted hydrocarbon group) but also a hydrocarbon group which contains a substituent (substituted hydrocarbon group). The same is true of each compound.

In the present invention, "radiation" means, for example, far ultraviolet, extreme ultraviolet (EUV), X-rays, electron beams, and the like. In addition, in the present invention, light means actinic rays or radiation. In the present invention, unless otherwise specified, "exposure" includes not only exposure, far ultraviolet, X-rays, and EUV, and the like, but also lithography by particle beams such as electron beams or ion beams.

[Member]

The member according to an embodiment of the present invention is a member that will come into contact with a chemical liquid.

The surface of the member is constituted with stainless steel containing chromium atoms and iron atoms.

Furthermore, in a case where an atomic ratio of the chromium atoms to the iron atoms is measured from the surface of the member to a portion 10 nm below the surface along a depth direction, the maximum value of the atomic ratio (Cr/Fe ratio) is found in a region extending 3 nm from the surface of the member in the depth direction. The maximum value is 0.5 to 3.0.

In addition, the average surface roughness of the surface of the member is equal to or lower than 10 nm.

In a case where the member constituted as above is used, the objects of the present invention are achieved, but the mechanism is unclear. According to the inventors of the present invention, presumably, in the stainless steel, because the relationship between the Cr/Fe ratio profile in the depth direction and the surface roughness is controlled and falls into a certain range, the migration of metal components to a chemical liquid or the like from the stainless steel could be synergistically inhibited, and the obtained residue defect inhibition properties and bridge defect inhibition properties of the chemical liquid may be improved.

The residue defect is, for example, a particle-like defect which occurs in a case where the chemical liquid is used as a prewet solution or a rinsing solution. The bridge defect is, for example, a defect which is in the form of a crosslink between patterns and occurs in a case where the chemical liquid is used for forming patterns.

Hereinafter, a case where at least either the residue defect inhibition properties or the bridge defect inhibition properties of a chemical liquid are excellent will be described as "the effects of the present invention are excellently exhibited" and the like.

Furthermore, by the member according to the embodiment of the present invention, a liquid contact member in which a fluororesin material has been conventionally used can be replaced with a stainless steel member. As a result, the risk such as the damage of the liquid contact member and/or the contamination of the liquid resulting from the generation of static electricity can be reduced.

[Stainless Steel]

The surface of the member according to the embodiment of the present invention is constituted with stainless steel containing chromium atoms and iron atoms.

As long as the surface of the member according to the embodiment of the present invention is constituted with the stainless steel, the member may be totally constituted with the stainless steel or has a base material that is constituted with a material other than stainless steel and a coating layer that is disposed on the base material and formed of the stainless steel. That is, the member may have a base material other than stainless steel and a coating layer that is disposed on the base material and formed of stainless steel, and the coating layer may satisfy the requirements that will be described later.

<Cr/Fe Ratio>

The stainless steel contains chromium atoms and iron atoms.

Furthermore, in a case where an atomic ratio (Cr/Fe ratio) of the chromium atoms to the iron atoms is measured from the surface of the member to a position 10 nm below the surface along a depth direction, the maximum value of the atomic ratio is found in a region extending 3 nm from the surface of the member in the depth direction.

In a case where the depth from the surface of the member at which the Cr/Fe ratio is maximized is defined as specific depth, it is also possible to say that the specific depth is in a region extending 3 nm from the surface of the member in the depth direction.

The maximum value of the Cr/Fe ratio in the above stainless steel (in other words, the Cr/Fe ratio at a specific depth) is 0.5 to 3.0, preferably 0.7 to 2.8, and more preferably 1.1 to 2.5.

The specific depth may be within a region extending 3 nm from the surface of the member in a liquid contact portion in the depth direction, and the surface of the member (depth: 0 nm) may be the specific depth.

The Cr/Fe ratio within the surface (depth: 0 nm) of the member is 0.4 to 3.0, preferably 0.7 to 2.8, and more preferably 1.1 to 2.5.

Furthermore, it is preferable that the greater the depth from the surface of the member is than the specific depth, the lower the Cr/Fe ratio is in the stainless steel.

The Cr/Fe ratio at a position 10 nm deep from the surface of the member is not particularly limited, but is preferably 0.3 to 0.6 and more preferably 0.3 to 0.5.

Below the depth of 10 nm from the surface of the member, the value of the Cr/Fe ratio in the depth direction is not particularly limited but is preferably substantially constant. "Substantially constant" means that the absolute value of the rate of change from the Cr/Fe ratio in a position at 10 nm is equal to or lower than 5%. The rate of change is expressed by (Cr/Fe ratio at 10 nm−Cr/Fe ratio at a predetermined position)/(Cr/Fe ratio at 10 nm)×100.

In the present specification, the Cr/Fe ratio at each depth is measured as follows.

First, Ar gas etching is performed on the surface of the member for 60 minutes. The average etching speed is calculated from the depth of a portion etched (etching depth), and the etching treatment time required to etch the surface to a desired depth is determined. At this time, the etching depth is measured using an atomic force microscope (AFM).

Based on the determined etching treatment time, the member is etched by 1 nm from the surface thereof, and the surface is analyzed at each depth by using electron spectroscopy for chemical analysis (ESCA, for example, ESCA- 3400 manufactured by Shimadzu Corporation). From the peak intensity, atoms % of each element is calculated, and the Cr/Fe ratio is determined.

The Cr/Fe ratio within the surface of the member is a calculated value obtained by analyzing the surface by using ESCA without performing etching described above.

<Average Surface Roughness>

The average surface roughness (Ra) of the surface of the member is equal to or lower than 10 nm, preferably 0.10 to 10 nm, and more preferably 0.20 to 5 nm.

In a case where the average surface roughness is equal to or lower than 10 nm, the microscopic contact area between the surface of the member and a chemical liquid or the like can be reduced. Accordingly, it is possible to inhibit the surface of the member from affecting the content of impurities in the chemical liquid. In a case where the average surface roughness is equal to or higher than 0.10 nm, it is easy to avoid the mixing of fine metal particles generated in the process of smoothing the surface into the chemical liquid, and the effects of the present invention are further improved.

In the present invention, the average surface roughness of the stainless steel can be measured using an atomic force microscope (AFM).

<Surface Treatment>

It is preferable that the surface of the member has undergone a surface treatment.

The surface treatment is preferably performed by electropolishing.

As a treatment liquid (electrolytic solution) in the electropolishing, a mixed solution of phosphoric acid and sulfuric acid is preferable. The mixing ratio is, for example, preferably 85% by mass phosphoric acid:98% by mass sulfuric acid=4:3 (volume ratio).

The liquid temperature during the electropolishing is preferably 30° C. to 60° C., and more preferably 40° C. to 50° C.

The current density during the electropolishing is preferably 10 to 20 $A/dm^2$.

The electropolishing time is preferably 10 to 120 minutes, and more preferably 30 to 60 minutes.

The surface of the member preferably has undergone a pre-treatment (buffing, magnetic fluid polishing, or the like) and/or a post-treatment (annealing, an acid treatment, or the like) performed before and after the electropolishing, and more preferably has undergone a pre-treatment.

Buffing is preferable as the pre-treatment.

The size of abrasive grains used for the buffing treatment is preferably equal to or smaller than #400, more preferably #1,000 to #400, and even more preferably #600 to #400.

Examples of the treatment liquid used for the acid treatment include acids such as sulfuric acid, phosphoric acid, hydrochloric acid, hydrofluoric acid, and a mixed acid containing one or more kinds of these acids, and dilute aqueous solutions of the above acids. Examples of the acid treatment include a method of bringing the treatment liquid into contact with a surface to be treated. More specifically, for example, a method of immersing an object to be treated in a treatment layer filled with the treatment liquid may be used. At this time, the treatment liquid may be subjected to circulation and/or heating and the like as appropriate.

Furthermore, the acid treatment may be performed by a method of coating a surface to be treated with the treatment liquid formed into a paste.

The stainless steel is not particularly limited as long as the surface of the member satisfies predetermined requirements, and known stainless steel can be used. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

[Use]

The member according to the embodiment of the present invention is preferably used for at least one kind of purpose selected from the group consisting of manufacturing, storage, transport, and transfer of a chemical liquid (preferably a chemical liquid for manufacturing semiconductors).

Specifically, for example, the member is used in a container storing a chemical liquid, a chemical liquid manufacturing device (a purification device, a reaction device, or the like), a pipe line, and the like.

The member according to the embodiment of the present invention is also suitably used even in a case where a chemical liquid that will come into contact with the member (a chemical liquid that will be manufactured, stored, transported, and/or transferred) has a volume resistivity equal to or higher than 500,000,000 Ωm.

Particularly, in a case where a chemical liquid which will be stored in a chemical liquid storage body according to an embodiment of the present invention that will be described later or a chemical liquid in a chemical liquid manufacturing method according to an embodiment of the present invention that will be described later has a volume resistivity equal to or higher than 500,000,000 Ωm, the member according to the embodiment of the present invention (such as a container according to an embodiment of the present invention, a reactor according to an embodiment of the present invention, a distillation column according to an embodiment of the present invention, a filter unit according to an embodiment of the present invention, a storage tank according to an embodiment of the present invention, and/or a pipe line according to an embodiment of the present invention) can be suitably used.

In a case where the chemical liquid having such a high volume resistivity is brought into contact with a member made of a fluororesin material, the risk such as the damage of a liquid contact member and/or the contamination of the liquid resulting from electric discharge occurs. In contrast, being constituted with stainless steel, the surface of the member according to the embodiment of the present invention is not charged with static electricity, and hence the above risk can be reduced. Furthermore, in the member according to the embodiment of the present invention, the migration of metal components from the metal material (stainless steel) is inhibited, and it is considered that the chemical liquid contamination resulting from factors other than metal materials may hardly occur.

The volume resistivity of the chemical liquid can be measured using, for example, a volume resistance meter SME-8310 or a super megohmmeter SM-8220 manufactured by HIOKI E.E CORPORATION. The volume resistivity is measured at a temperature of 23° C.

In a case where the charge potential of the chemical liquid that is in contact with the member according to the embodiment of the present invention is within a range of −2 kV to 2 kV, it is possible to determine that the aforementioned risk (the damage of the liquid contact member and/or the contamination of the liquid resulting from electric discharge) is small.

The static electricity (charge potential) of the chemical liquid can be measured as follows, for example. That is, a PFA-HG tube manufactured by NICHIAS Corporation (inner diameter: 4.35 mm, outer diameter: 6.35 mm) is cut in a length of 3 m, a liquid to be measured (chemical liquid) is passed through the tube at a flow rate of 0.5 m/sec, and the charge potential of the outside of the tube is measured at around the center of the tube (position 1.5 m distant from both ends of the tube) by using a digital electrostatic potentiometer KSD-3000 manufactured by KASUGA DENKI, Inc. The static electricity can be measured in this way. The volume resistivity is measured at a temperature of 23° C.

[Container]

The container according to an embodiment of the present invention is formed of the member according to the embodiment of the present invention (hereinafter, also called "specific member").

More specifically, the container according to the embodiment of the present invention is a container storing a chemical liquid, and at least a part of a liquid contact portion of the container is constituted with the specific member.

In other words, the container according to the embodiment of the present invention is a container storing a chemical liquid, and at least a part of the liquid contact portion of the container is constituted with stainless steel containing chromium atoms and iron atoms. In a case where the atomic ratio of the chromium atoms to the iron atoms is measured from the container surface in the liquid contact portion to a position 10 nm below the container surface in a depth direction, the maximum value of the atomic ratio is found in a region extending 3 nm from the container surface in the depth direction. Furthermore, the maximum value of the atomic ratio is 0.5 to 3.0, and the average surface roughness of the container surface in the liquid contact portion is equal to or lower than 10 nm.

Hereinafter, the container will be specifically described using a drawing.

FIG. 1 is a schematic view of a container with a lid that includes the container according to the embodiment of the present invention and a lid.

A container 10 with a lid includes a hollow container 11 and a lid 12. By a male screw not shown in the drawing that is provided on the outside of a mouth portion 13 of the container and a female screw not shown in the drawing that is disposed on the inside of a lateral portion 14 of the lid 12, the container 11 and the lid 12 can be fitted with each other. By the container 11 and the lid 12 fitted with each other, a cavity L is formed in the interior of the container 10 with a lid. A chemical liquid (for example, a chemical liquid for manufacturing semiconductors) can be stored in the cavity L.

The liquid contact portion of the container 10 with a lid is formed of the specific member.

That is, an inner wall surface 15 as the liquid contact portion of the container 10 with a lid is constituted with stainless steel containing chromium atoms and iron atoms.

The aforementioned specific depth of the inner wall surface 15 is in a region extending 3 nm from the surface in a depth direction. The Cr/Fe ratio at the specific depth is 0.5 to 3.0, and the average surface roughness of the surface is equal to or lower than 10 nm.

FIG. 1 shows an aspect in which the entirety of the inner wall surface 15 of the container 10 with a lid is formed of the specific member. However, the container according to the embodiment of the present invention is not limited thereto, and at least a part of the liquid contact portion of the inner wall surface may be constituted with the specific member. More specifically, the surface area of the liquid contact portion formed of the specific member preferably accounts for 70% or more of the total surface area of the liquid contact portion, more preferably accounts for 80% or more of the total surface area of the liquid contact portion, even more preferably accounts for 90% or more of the total surface area of the liquid contact portion, and particularly preferably accounts for 100% of the total surface area of the liquid contact portion.

Even though a chemical liquid is stored in the container, and the container storing the chemical liquid is kept as it is, because the liquid contact portion (a surface coming into contact with the stored substance; the liquid contact portion means a portion which is likely to contact the stored substance even though the portion does not actually come into contact with the stored substance) of the container is formed of the specific member (constituted with the member), the content of impurities in the chemical liquid is hardly affected. Therefore, the effects of the present invention are excellently exhibited.

In the container 10 with a lid, the inner wall surface 15 is constituted with the specific member. However, an outer wall surface 16 may be constituted with the specific member.

[Chemical Liquid Storage Body]

The chemical liquid storage body according to an embodiment of the present invention includes the container described above and a chemical liquid stored in the container. In the chemical liquid storage body according to the embodiment of the present invention, at least a part of the liquid contact portion of the container is formed of the specific member. Therefore, even though the chemical liquid storage body is kept for a long period of time, the content of impurities in the stored chemical liquid is hardly affected. Accordingly, the effects of the present invention are excellently exhibited.

<Chemical Liquid>

The chemical liquid is preferably a chemical liquid for manufacturing semiconductors. As the chemical liquid, a chemical liquid is preferable in which the amounts of metal impurities and organic impurities are reduced. The type of the chemical liquid is not particularly limited, and examples thereof include high-purity liquids such as an abrasive, a liquid containing a resist composition, a prewet solution, a developer, a rinsing solution, a peeling solution, and the like used for manufacturing semiconductors, and high-purity liquids such as polyimide, a developer such as a resist for sensor and a resist for lens, a rinsing solution, and the like used for purposes other than the manufacturing of semiconductors.

As one of the preferred aspects, the chemical liquid contains an organic solvent.

Hereinafter, the chemical liquid will be described by being divided into an organic solvent-based chemical liquid in which the content of an organic solvent (total solvent in a case where the chemical liquid contains a plurality of organic solvents) is greater than 50% by mass with respect to the total mass of solvents contained in the chemical liquid and an aqueous chemical liquid in which the content of water is greater than 50% by mass with respect to the total mass of solvents contained in the chemical liquid.

(Organic Solvent-Based Chemical Liquid)

The organic solvent-based chemical liquid contains solvents, in which the content of an organic solvent is greater than 50% by mass with respect to the total mass of the solvents contained in the chemical liquid.

The organic solvent-based chemical liquid contains an organic solvent. The content of the organic solvent in the organic solvent-based chemical liquid is not particularly limited, but is preferably equal to or greater than 99.0% by mass with respect to the total mass of the organic solvent-based chemical liquid in general. The upper limit thereof is not particularly limited, but is preferably equal to or smaller than 99.99999% by mass in general.

One kind of organic solvent may be used singly, or two or more kinds of solvents may be used in combination. In a case where two or more kinds of organic solvents are used in combination, the total content thereof is preferably within the above range.

In the present specification, an organic solvent means one liquid organic compound which is contained in the chemical liquid in an amount greater than 10,000 mass ppm with respect to the total mass of the chemical liquid. That is, in the present specification, a liquid organic compound contained in the chemical liquid in an amount greater than 10,000 mass ppm with respect to the total mass of the chemical liquid corresponds to an organic solvent.

In the present specification, "liquid" means that the compound stays in liquid form at 25° C. under atmospheric pressure.

The type of organic solvent of the organic solvent-based chemical liquid is not particularly limited, and known organic solvents can be used. Examples of the organic solvent include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may contain a ring (preferably having 4 to 10 carbon atoms), alkylene carbonate, alkoxyalkyl acetate, alkyl pyruvate, dialkyl sulfoxide, cyclic sulfone, dialkyl ether, a monohydric alcohol, glycol, an acetic acid alkyl ester, N-alkylpyrrolidone, and the like.

Furthermore, as the organic solvent, the organic solvents described in JP2016-057614A, JP2014-219664A, JP2016-138219A, and JP2015-135379A may be used.

It is preferable that the organic solvent has a Hansen solubility parameter distance of 3 to 20 $MPa^{0.5}$ (more preferably 5 to 20 $MPa^{0.5}$) to eicosene, for example.

In a case where two or more kinds of organic solvents are used, it is preferable that at least one kind of organic solvent satisfies the above range of the Hansen solubility parameter.

In a case where two or more organic solvents are used, it is preferable that an weighted average of the Hansen solubility parameters based on the molar ratio of the contents of the organic solvents satisfies the above range of the Hansen solubility parameter.

For example, it is preferable that the chemical liquid contains only an organic solvent that substantially satisfies the above range of the Hansen solubility parameter. "The chemical liquid contains only an organic solvent that substantially satisfies the above range of the Hansen solubility parameter" means that the content of the organic solvent satisfying the above range of the Hansen solubility parameter is equal to or greater than 99% by mass (preferably equal to or greater than 99.9% by mass) with respect to the total mass of organic solvents.

Furthermore, for example, it is also preferable that the organic solvent is a mixed solvent containing both the organic solvent that satisfies the above range of the Hansen solubility parameter and the organic solvent that does not satisfy the above range of the Hansen solubility parameter.

In this case, it is preferable that the chemical liquid (mixed solvent) contains 20% to 80% by mass (preferably 30% to 70% by mass) of the organic solvent satisfying the above range of the Hansen solubility parameter with respect to the total mass of the chemical liquid and 20% to 80% by mass (preferably 30% to 70% by mass) of the organic solvent not satisfying the above range of the Hansen solubility parameter with respect to the total mass of the chemical liquid.

Presumably, in a case where each of the content of the organic solvent satisfying the above range of the Hansen solubility parameter and the content of the organic solvent not satisfying the above range of the Hansen solubility parameter is within a specific range, the affinity of the chemical liquid with a metallic material and an organic material could be adjusted to a more appropriate range than in a case where the content of the organic solvent not satisfying the above range of the Hansen solubility parameter is excessively high or low (for example, a case where the content of such an organic solvent is equal to or greater than 1% by mass and less than 20% by mass or greater than 80% by mass with respect to the total mass of the chemical liquid (mixed solvent)), and the effects of the present invention may be further improved.

Furthermore, in this case, the total content of the organic solvent satisfying the above range of the Hansen solubility parameter and the organic solvent not satisfying the above range of the Hansen solubility parameter is preferably equal to or greater than 99.0% by mass with respect to the total mass of the chemical liquid. The upper limit thereof is not particularly limited, but is preferably equal to or smaller than 99.99999% by mass in general.

The Hansen solubility parameter distance between eicosene and the organic solvent not satisfying the above range of the Hansen solubility parameter is equal to or greater than 0 $MPa^{0.5}$ and less than 3 $MPa^{0.5}$ (preferably greater than 0 $MPa^{0.5}$ and less than 3 $MPa^{0.5}$) or greater than 20 $MPa^{0.5}$ (preferably greater than 20 $MPa^{0.5}$ and equal to or smaller than 50 $MPa^{0.5}$).

The Hansen solubility parameters in the present specification mean the Hansen solubility parameters described in "Hansen Solubility Parameters: A Users Handbook, Second Edition" (pp. 1-310, CRC Press, 2007). That is, the Hansen solubility parameters describe solubility by using multi-dimensional vectors (a dispersion element (δd), a dipole-dipole element (δp), and a hydrogen bond element (δh)). These three parameters can be considered as the coordinates of a point in a three-dimensional space called Hansen space.

The Hansen solubility parameter distance is a distance between two kinds of compounds in the Hansen space, and is calculated by the following equation.

$$(Ra)^2=4(\delta d2-\delta d1)^2+(\delta p2-\delta p1)^2+(\delta h2-\delta h1)^2$$

Ra: Hansen solubility parameter distance between first compound and second compound (unit: $MPa^{0.5}$)

δd1: dispersion element of first compound (unit: $MPa^{0.5}$)

δd2: dispersion element of second compound (unit: $MPa^{0.5}$)

δp1: dipole-dipole element of first compound (unit: $MPa^{0.5}$)

δp2: dipole-dipole element of second compound (unit: $MPa^{0.5}$)

δh1: hydrogen bond element of first compound (unit: $MPa^{0.5}$)

δh2: hydrogen bond element of second compound (unit: $MPa^{0.5}$)

In the present specification, specifically, the Hansen solubility parameters of a compound are calculated using Hansen Solubility Parameter in Practice (HSPiP).

It is preferable that the organic solvent contains one or more kinds of compounds selected from the group consisting of propylene glycol monomethyl ether acetate, propylene glycol monomethyl ether, butyl acetate, cyclohexanone, 4-methyl-2-pentanol, isopropanol, ethanol, acetone, propylene carbonate, γ-butyrolactone, isoamyl acetate, propylene glycol monoethyl ether, propylene glycol monopropyl ether, ethyl lactate, methyl methoxypropionate, cyclopentanone, diisoamyl ether, dimethyl sulfoxide, N-methylpyrrolidone, diethylene glycol, ethylene glycol, dipropylene glycol, propylene glycol, ethylene carbonate, sulfolane, cycloheptanone, 2-heptanone, butyl butyrate, isobutyl isobutyrate, undecane, pentyl propionate, isopentyl propionate, ethylcyclohexane, mesitylene, decane, 3,7-dimethyl-3-octanol, 2-ethyl-1-hexanol, 1-octanol, 2-octanol, ethyl acetoacetate, dimethyl malonate, methyl pyruvate, and dimethyl oxalate.

The type and content of the organic solvent in the chemical liquid can be measured using a gas chromatography mass spectrometer.

Metal Component

The organic solvent-based chemical liquid may contain metal component.

In the present invention, the metal component is, for example, metal particles.

Examples of the metal element in the metal component include Al (aluminum), B (boron), Ba (barium), Ca (calcium), Cd (cadmium), Co (cobalt), Cr (chromium), Cu (copper), Fe (iron), K (potassium), Li (lithium), Mg (magnesium), Mn (manganese), Mo (molybdenum), Na (sodium), Ni (nickel), P (phosphorus), Pb (lead), Sb (antimony), Si (silicon), Ti (titanium), V (vanadium), and Zn (zinc).

Among these, one or more kinds of elements selected from the group consisting of Ni, Fe, and Cr are preferable as the metal element in the metal component. Hereinafter, these metal elements will be also called specific metal elements. Furthermore, the metal component and metal particles containing the specific metal elements will be also called specific metal component and specific metal particles respectively.

The metal particles may be a simple metal, an alloy, an oxide, a nitride, an oxynitride, or another metal compound. Alternatively, the metal particles may be in the form of aggregates of a metal (including a metal compound) and an organic substance. In addition, the valence of the metal is not limited.

The metal component may be a metal component which is inevitably incorporated into the chemical liquid or a metal component inevitably incorporated into the chemical liquid during the manufacturing, storage, and/or transfer of a treatment liquid. Alternatively, the metal component may be intentionally added.

In a case where the specific member is used in the liquid contact portion, it is possible to inhibit the change in the content of the metal component (particularly, the specific metal particles) in the chemical liquid. As a result, excellent residue defect inhibition properties and excellent bridge defect inhibition properties are obtained.

In a case where the chemical liquid contains a metal component (preferably the specific metal component), the content of the metal component with respect to the total mass of the chemical liquid is, for example, preferably 0.1 to 100 mass ppt, and more preferably 0.1 to 10 mass ppt.

In a case where the chemical liquid contains metal particles (preferably the specific metal particles), the content of the metal particles with respect to the total mass of the chemical liquid is, for example, preferably 0.001 to 100 mass ppt, and more preferably 0.001 to 10 mass ppt.

The type and content of the metal particles (specific metal particles) in the chemical liquid can be measured by single particle inductively coupled plasma mass spectrometry (SP-ICP-MS).

The device used in SP-ICP-MS is the same as the device used in general inductively coupled plasma mass spectrometry (ICP-MS). The only difference between SP-ICP-MS and ICP-MS is how to analyze data. With SP-ICP-MS, data can be analyzed using commercial software.

With ICP-MS, the content of metal components as a measurement target is measured regardless of the way the metal components are present.

The type and content of the metal particles can be measured by the method described in Examples by using the device for SP-ICP-MS such as Agilent 8800 triple quadrupole inductively coupled plasma mass spectrometry (ICP-MS, for semiconductor analysis, option #200) manufactured by Agilent Technologies, Inc. In addition, NexION350S manufactured by PerkinElmer Inc. and Agilent 8900 manufactured by Agilent Technologies, Inc. can also be used.

Other Components

The chemical liquid may contain other components in addition to the above components. Examples of those other components include a resin, an organic substance other than a resin, water, and the like.

Resin

The chemical liquid may contain a resin.

The chemical liquid may further contain a resin. As the resin, a resin P containing a group which is decomposed by the action of an acid and generates a polar group is more preferable.

As the resin P, a resin containing a repeating unit represented by Formula (AI) that will be described later is more preferable, which is a resin whose solubility in a developer containing an organic solvent as a main component is reduced by the action of an acid. The resin containing a repeating unit represented by Formula (AI), which will be described later, contains a group that is decomposed by the action of an acid and generates an alkali-soluble group (hereinafter, also called "acid-decomposable group").

Examples of the polar group include an alkali-soluble group. Examples of the alkali-soluble group include a carboxy group, a fluorinated alcohol group (preferably a hexafluoroisopropanol group), a phenolic hydroxyl group, and a sulfo group.

In the acid-decomposable group, the polar group is protected with a group leaving by an acid (acid leaving group). Examples of the acid leaving group include $-C(R_{36})(R_{37})(R_{38})$, $-C(R_{36})(R_{37})(OR_{39})$, $-C(R_{01})(R_{02})(OR_{39})$, and the like.

In the formulas, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P whose solubility in a developer containing an organic solvent as a main component is reduced by the action of an acid will be specifically described.

Formula (AI): Repeating Unit Containing Acid-Decomposable Group

It is preferable that the resin P contains a repeating unit represented by Formula (AI).

(AI)

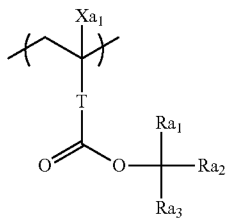

In Formula (AI), $Xa_1$ represents a hydrogen atom or an alkyl group which may contain a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may be bonded to each other to form a cycloalkyl group (monocyclic or polycyclic).

Examples of the alkyl group which is represented by $Xa_1$ and may contain a substituent include a methyl group and a group represented by $—CH_2—R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formulas, Rt represents an alkylene group or a cycloalkylene group.

T is preferably a single bond or a —COO-Rt- group. Rt is preferably an alkylene group having 1 to 5 carbon atoms, and more preferably a $—CH_2—$ group, a $—(CH_2)_2—$ group, or a $—(CH_2)_3—$ group.

The alkyl group represented by $Ra_1$ to $Ra_3$ is preferably an alkyl group having 1 to 4 carbon atoms.

The cycloalkyl group represented by $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The cycloalkyl group formed by the bonding of two out of $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. Among these, a monocyclic cycloalkyl group having 5 or 6 carbon atoms is more preferable.

In the cycloalkyl group formed by the bonding of two out of $Ra_1$ to $Ra_3$, for example, one of the methylene groups constituting a ring may be substituted with a hetero atom such as an oxygen atom or with a group containing a hetero atom such as a carbonyl group.

As the repeating unit represented by Formula (AI), for example, an aspect is preferable in which $Ra_1$ is a methyl group or an ethyl group, and $Ra_2$ and $Ra_3$ are bonded to each other to form the cycloalkyl group described above.

Each of the above groups may contain a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The content of the repeating unit represented by Formula (AI) with respect to all the repeating units in the resin P is preferably from 20 to 90 mol %, more preferably from 25 to 85 mol %, and even more preferably from 30 to 80 mol %.

Repeating Unit Containing Lactone Structure

Furthermore, it is preferable that the resin P contains a repeating unit Q containing a lactone structure.

The repeating unit Q containing a lactone structure preferably has a lactone structure on a side chain. The repeating unit Q is more preferably a repeating unit derived from a (meth)acrylic acid derivative monomer.

One kind of repeating unit Q containing a lactone structure may be used singly, or two or more kinds of repeating units Q may be used in combination. However, it is preferable to use one kind of repeating unit Q singly.

The content of the repeating unit Q containing a lactone structure with respect to all the repeating units in the resin P is preferably 3 to 80 mol %, and more preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure contains a repeating unit containing a lactone structure represented by any of Formulas (LC1-1) to (LC1-17). The lactone structure is preferably a lactone structure represented by Formula (LC1-1), Formula (LC1-4), Formula (LC1-5), or Formula (LC1-8), and more preferably a lactone structure represented by Formula (LC1-4).

LC1-1

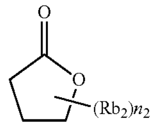

LC1-2

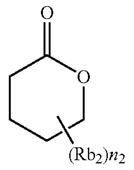

LC1-3

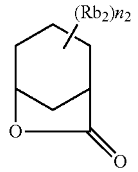

LC1-4

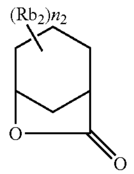

-continued

LC1-5

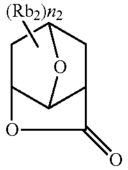

LC1-6

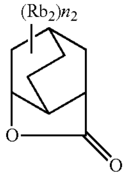

LC1-7

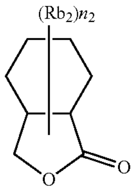

LC1-8

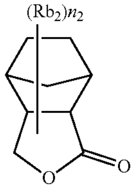

LC1-9

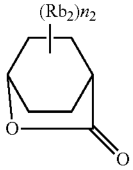

LC1-10

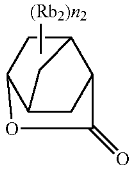

LC1-11

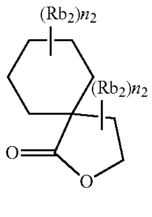

LC1-12

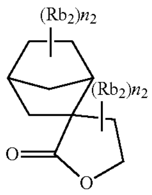

-continued

LC1-13

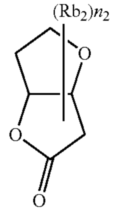

LC1-14

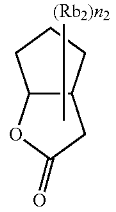

LC1-15

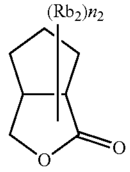

LC1-16

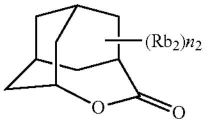

LC1-17

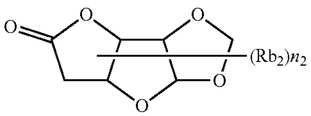

The lactone structure portion may contain a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents ($Rb_2$) may be the same as or different from each other, and the plurality of substituents ($Rb_2$) may be bonded to each other to form a ring.

Repeating Unit Containing Phenolic Hydroxyl Group

The resin P may also contain a repeating unit containing a phenolic hydroxyl group.

Examples of the repeating unit containing a phenolic hydroxyl group include a repeating unit represented by General Formula (I).

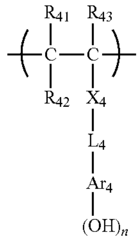

(I)

In the formula, $R_{41}$, $R_{42}$ and $R_{43}$ each independently represent a hydrogen atom, an alkyl group, a halogen atom, a cyano group, or an alkoxycarbonyl group. Here, $R_{42}$ may be bonded to $Ar_4$ to form a ring, and in this case, $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents an (n+1)-valent aromatic ring group. In a case where $Ar_4$ is bonded to $R_{42}$ to form a ring, $Ar_4$ represents an (n+2)-valent aromatic ring group.

n represents an integer of 1 to 5.

As the alkyl group represented by $R_{41}$, $R_{42}$, and $R_{43}$ in General Formula (I), an alkyl group having 20 or less carbon atoms, such as a methyl group, an ethyl group, a propyl group, an isopropyl group, a n-butyl group, a sec-butyl group, a hexyl group, a 2-ethylhexyl group, an octyl group, or a dodecyl group which may have a substituent, is preferable, an alkyl group having 8 or less carbon atoms is more preferable, and an alkyl group having 3 or less carbon atoms is even more preferable.

The cycloalkyl group represented by $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may contain a substituent.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable.

As the alkyl group included in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the substituent in each of the above groups include an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

$Ar_4$ represents an (n+1)-valent aromatic ring group. In a case where n is 1, the divalent aromatic ring group may contain a substituent, and examples thereof include arylene groups having 6 to 18 carbon atoms, such as a phenylene group, a tolylene group, a naphthylene group, and an anthracenylene group, and aromatic ring groups containing a hetero ring such as thiophene, furan, pyrrole, benzothiophene, benzofuran, benzopyrrole, triazine, imidazole, benzimidazole, triazole, thiadiazole, and thiazole.

In a case where n is an integer equal to or greater than 2, specific examples of the (n+1)-valent aromatic ring group include groups obtained by removing (n−1) pieces of any hydrogen atom from the aforementioned specific examples of the divalent aromatic ring group.

The (n+1)-valent aromatic ring group may further contain a substituent.

Examples of the substituent that the aforementioned alkyl group, cycloalkyl group, alkoxycarbonyl group, alkylene group, and (n+1)-valent aromatic ring group can contain include the alkyl group exemplified above as $R_{41}$, $R_{42}$, and $R_{43}$ in General Formula (I); an alkoxy group such as a methoxy group, an ethoxy group, a hydroxyethoxy group, a propoxy group, a hydroxypropoxy group, and a butoxy group; and an aryl group such as a phenyl group.

Examples of the alkyl group represented by $R_{64}$ in —$CONR_{64}$—($R_{64}$ represents a hydrogen atom or an alkyl group) represented by $X_4$ include an alkyl group having 20 to or less carbon atoms, such as a methyl group, an ethyl group, a propyl group, an isopropyl group, a n-butyl group, a sec-butyl group, a hexyl group, a 2-ethylhexyl group, an octyl group, and a dodecyl group which may contain a substituent. Among these, an alkyl group having 8 or less carbon atoms is more preferable.

$X_4$ is preferably a single bond, —COO—, or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, and an octylene group which may contain a substituent.

$Ar_4$ is preferably an aromatic ring group having 6 to 18 carbon atoms that may contain a substituent, and more preferably a benzene ring group, a naphthalene ring group, or a biphenylene ring group.

It is preferable that the repeating unit represented by General Formula (I) comprises a hydroxystyrene structure. That is, $Ar_4$ is preferably a benzene ring group.

The content of the repeating unit containing a phenolic hydroxyl group with respect to all the repeating units in the resin P is preferably 0 to 50 mol %, more preferably 0 to 45 mol %, and even more preferably 0 to 40 mol %.

Repeating Unit Containing Organic Group Containing Polar Group

The resin P may further contain a repeating unit containing an organic group containing a polar group, particularly, a repeating unit containing an alicyclic hydrocarbon structure substituted with a polar group. In a case where the resin P further contains such a repeating unit, the substrate adhesion and the affinity with a developer are improved.

The alicyclic hydrocarbon structure substituted with a polar group is preferably an adamantyl group, a diamantyl group, or a norbornane group. As the polar group, a hydroxyl group or a cyano group is preferable.

In a case where the resin P contains a repeating unit containing an organic group containing a polar group, the content of such a repeating unit with respect to all the repeating units in the resin P is preferably 1 to 50 mol %, more preferably 1 to 30 mol %, even more preferably 5 to 25 mol %, and particularly preferably 5 to 20 mol %.

Repeating Unit Represented by General Formula (VI)

The resin P may also contain a repeating unit represented by General Formula (VI).

(VI)

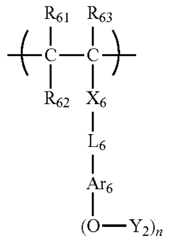

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and in this case, $R_{62}$ represents a single bond or an alkylene group.

$X_6$ represents a single bond, —COO—, or —$CONR_{64}$—. $R_{64}$ represents a hydrogen atom or an alkyl group.

$L_6$ represents a single bond or an alkylene group.

$Ar_6$ represents an (n+1)-valent aromatic ring group. In a case where $Ar_6$ is bonded to $R_{62}$ to form a ring, $Ar_6$ represents an (n+2)-valent aromatic ring group.

In a case where n≥2, $Y_2$ each independently represents a hydrogen atom or a group which leaves by the action of an acid. Here, at least one of $Y_2$'s represents a group which leaves by the action of an acid.

n represents an integer of 1 to 4.

As the group $Y_2$ which leaves by the action of an acid, a structure represented by General Formula (VI-A) is preferable.

(VI-A)

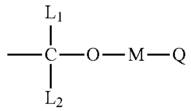

$L_1$ and $L_2$ each independently represent a hydrogen atom, an alkyl group, a cycloalkyl group, an aryl group, or a group obtained by combining an alkylene group with an aryl group.

M represents a single bond or a divalent linking group.

Q represents an alkyl group, a cycloalkyl group which may contain a hetero atom, an aryl group which may contain a hetero atom, an amino group, an ammonium group, a mercapto group, a cyano group, or an aldehyde group.

At least two out of Q, M, and Li may be bonded to each other to form a ring (preferably a 5- or 6-membered ring).

The repeating unit represented by General Formula (VI) is preferably a repeating unit represented by General Formula (3).

(3)

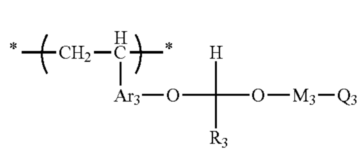

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two out of $Q_3$, $M_3$, and $R_3$ may be bonded to each other to form a ring.

The aromatic ring group represented by $Ar_3$ is the same as $Ar_6$ in General Formula (VI) in which n is 1. The aromatic ring group is preferably a phenylene group or a naphthylene group, and more preferably a phenylene group.

Repeating Unit Containing Silicon Atom on Side Chain

The resin P may further contain a repeating unit containing a silicon atom on a side chain. Examples of the repeating unit containing a silicon atom on a side chain include a (meth)acrylate-based repeating unit containing a silicon atom, a vinyl-based repeating unit containing a silicon atom, and the like. The repeating unit containing a silicon atom on a side chain is typically a repeating unit containing a group, which contains a silicon atom, on a side chain. Examples of the group containing a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formula, R and $R^1$ each independently represent a monovalent substituent. * represents a bond.

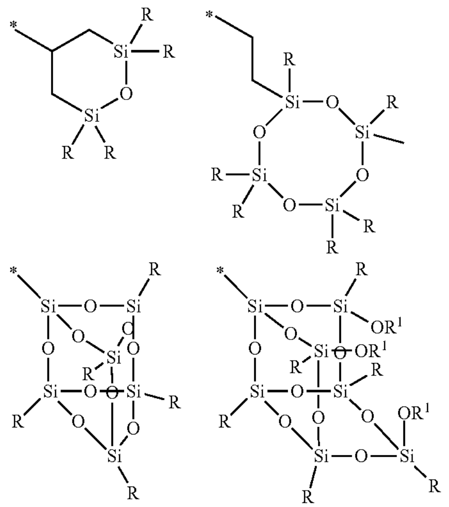

-continued

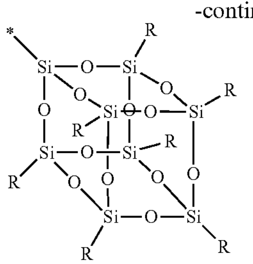

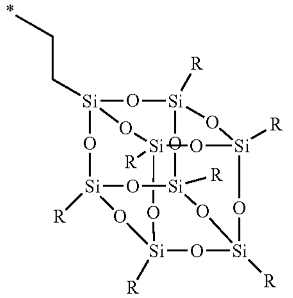

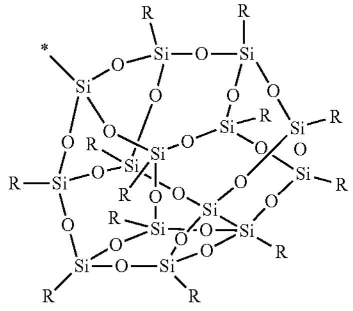

As the repeating unit containing the aforementioned group, for example, a repeating unit derived from an acrylate or methacrylate compound containing the aforementioned group or a repeating unit derived from a compound containing the aforementioned group and a vinyl group is preferable.

In a case where the resin P contains the repeating unit containing a silicon atom on a side chain, the content of such a repeating unit with respect to all the repeating units in the resin P is preferably 1 to 30 mol %, more preferably 5 to 25 mol %, and even more preferably 5 to 20 mol %.

The weight-average molecular weight of the resin P that is measured by gel permeation chromatography (GPC) and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, or to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

As other components (for example, an acid generator, a basic compound, a quencher, a hydrophobic resin, a surfactant, a solvent, and the like) to be incorporated into the chemical liquid, any known components can be used.

(High-Boiling-Point Organic Component)

It is also preferable that the chemical liquid contains a high-boiling-point organic component having a boiling point equal to or higher than 250° C. The high-boiling-point organic component means an organic compound contained in the chemical liquid in an amount equal to or smaller than 10,000 mass ppm with respect to the total mass of the chemical liquid. That is, in the present specification, an organic compound which is contained in the chemical liquid in an amount equal to or smaller than 10,000 mass ppm with respect to the total mass of the chemical liquid and has a boiling point equal to or higher than 250° C. corresponds to the high-boiling-point organic component but does not correspond to the organic solvent and the like described above.

The boiling point of the high-boiling-point organic component means a boiling point under normal pressure.

In a case where the chemical liquid contains the high-boiling-point organic component, the content of the high-boiling-point organic component with respect to the mass of the chemical liquid is preferably 0.01 to 500,000 mass ppt, more preferably 0.1 to 100,000 mass ppt, and even more preferably 0.1 to 20,000 mass ppt.

Presumably, particularly in a case where the content of the high-boiling-point organic component is equal to or greater than 0.1 mass ppt, the high-boiling-point organic component may be aggregated with a trace of metal component as if the metal component is incorporated into the high-boiling-point organic component, and hence the high-boiling-point organic component may be easily removed. It is considered that in a case where the chemical liquid is used in a semiconductor manufacturing process, it may be possible to inhibit the high-boiling-point organic component from remaining as a residue on an object to be treated. In addition, it is considered that in a case where the content of the high-boiling-point organic component is equal to or greater than 0.1 mass ppt, and the chemical liquid is brought into contact with a metal (such as the member according to the embodiment of the present invention), it may be possible to inhibit the metal from being eluted into the chemical liquid.

Furthermore, it is considered that in a case where the content of the high-boiling-point organic component is equal to or smaller than 100,000 mass ppt, and the chemical liquid is used in a semiconductor manufacturing process, it may be easy to inhibit an excess of high-boiling-point organic component from remaining as a residue on an object to be treated. The content of the high-boiling-point organic component in the chemical liquid can be measured by the as chromatography mass spectrometry (GC/MS).

(Aqueous Chemical Liquid)

In the aqueous chemical liquid, the content of water with respect to the total mass of solvents contained in the aqueous chemical liquid is greater than 50% by mass. The content of water in the aqueous chemical liquid is preferably 51% to 100% by mass, and more preferably 51% to 95% by mass.

The water is not particularly limited, but it is preferable to use ultrapure water used for manufacturing semiconductors. The ultrapure water is more preferably used after being further purified such that the inorganic anions, metal ions, and the like are reduced.

Alkaline Developer

The aqueous chemical liquid is preferably an alkaline developer, for example.

The pH of the alkaline developer at 25° C. is preferably equal to or higher than 10, more preferably equal to or higher than 12, and even more preferably equal to or higher than 13.

Organic Basic Compound

The alkaline developer preferably contains an organic basic compound which is more preferably a quaternary ammonium hydroxide salt or an amine compound and even more preferably a quaternary ammonium hydroxide salt.

The content of the organic basic compound in the alkaline developer with respect to the total mass of the aqueous chemical liquid is preferably 0.5% to 10% by mass, and more preferably 2% to 5% by mass.

Quaternary Ammonium Hydroxide Salt

Examples of the quaternary ammonium hydroxide salt include a compound represented by Formula (a1).

(a1)

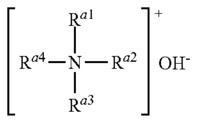

In Formula (a1), $R^{a1}$ to $R^{a4}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two out of $R^{a1}$ to $R^{a4}$ may be bonded to each other to form a cyclic structure. Particularly, the groups in at least either a combination of $R^{a1}$ and $R^{a2}$ or a combination of $R^{a1}$ and $R^{a4}$ may be bonded to each other to form a cyclic structure.

Among the compounds represented by Formula (a1), at least one kind of compound is preferable which is selected from the group consisting of tetramethylammonium hydroxide, benzyltrimethylammonium hydroxide, tetrabutylammonium hydroxide, tetraethylammonium hydroxide, tetrapropylammonium hydroxide, methyltripropylammonium hydroxide, methyltributylammonium hydroxide, ethyltrimethylammonium hydroxide, dimethyldiethylammonium hydroxide, hex adecyltrimethylammonium hydroxide, (2-hydroxyethyl)trimethylammonium hydroxide, and spiro-(1,1')-bipyrrolidinium hydroxide.

Other Components

The aqueous chemical liquid (including an alkaline developer) may contain other components in addition to the aforementioned organic basic compound. Examples of those other components include a metal component (the metal component is the same as the metal component described above regarding the organic solvent-based chemical liquid, and the preferred content of the metal component is also the same as described above), an oxidant, an inorganic acid other than the component described above regarding the aqueous chemical liquid, an anticorrosive other than the component described above regarding the aqueous chemical liquid, a surfactant, an organic solvent, a high-boiling-point organic component (the high-boiling-point organic component is the same as the high-boiling-point organic component described above regrading the organic solvent-based chemical liquid, and the preferred content of the high-boiling-point organic component is also the same as described above), and the like.

<Inert Gas>

It is also preferable that a void portion of the member according to the embodiment of the present invention (particularly an inner void portion of the container in the chemical liquid storage body according to an embodiment of the present invention) is filled with an inert gas.

The void portion means, for example, a space in the container not being filled with the chemical liquid in the chemical liquid storage body.

The inert gas is, for example, a purified gas from which impurities such as water and/or oil have been removed and which contains a stable gas at a high purity.

More specifically, the inert gas means a gas containing a stable gas (such as a rare gas (helium, neon, argon, krypton, or xenon) and/or nitrogen) at a purity equal to or higher than 95% by volume. The aforementioned purity is preferably equal to or higher than 99.9% by volume, more preferably equal to or higher than 99.999% by volume, and even more preferably higher than 99.9999% by volume. The upper limit thereof is not particularly limited and is, for example, 99.99999% by volume.

In addition, it is preferable that the stable gas having purity in the above range is in the void portion of the chemical liquid storage body.

The void fraction (volume occupied by the void portion) in the container in the chemical liquid storage body is preferably 2% to 80% by volume, more preferably 2% to 50% by volume, and even more preferably 5% to 30% by volume.

The void fraction is calculated according to Equation (1).

$$\text{Equation (1): Void fraction}=\{1-(\text{volume of chemical liquid in container}/\text{container volume})\}\times 100$$

The container volume has the same definition as the internal volume (capacity) of the container.

In a case where the void fraction is relatively low, the void holds a small amount of air, and hence the amount of an organic compound and the like in the air mixed into the chemical liquid is reduced. Accordingly, the composition of the stored chemical liquid is easily stabilized.

In a case where the void fraction is equal to or higher than 2% by volume, because there is an appropriate space in the container, it is easy to handle the chemical liquid.

[Manufacturing Device]

The manufacturing device according to an embodiment of the present invention is a chemical liquid manufacturing device and comprises, for example, at least one unit selected from the group consisting of a reactor, a distillation column, a filter unit, a storage tank, and a pipe line in which at least a part of a liquid contact portion is formed of the specific member.

Examples of the manufacturing device include a reaction device which is a manufacturing device for obtaining a chemical liquid as a reactant by reacting raw materials and a purification device which is a manufacturing device for obtaining a chemical liquid as a purified substance by purifying a substance to be purified.

The reaction device and the purification device may be used in combination. For example, the chemical liquid as a reactant obtained using the reaction device may be used as a substance to be purified, and a chemical liquid as a purified substance may be obtained using the purification device.

In a case where a chemical liquid (for example, a chemical liquid as a reactant) is used as a substance to be purified, "chemical liquid as a purified substance" generally means a chemical liquid obtained by further increasing the purity of "chemical liquid as a substance to be purified (for example, the chemical liquid as a reactant)".

In a case where the manufacturing device according to the chemical liquid manufacturing method of an embodiment of the present invention is used, a chemical liquid exhibiting excellent residue defect inhibition properties and excellent bridge defect inhibition properties is obtained. Furthermore, in a case where filtration is performed in the manufacturing process, the service life of the filter used can be extended.

Hereinafter, a method for manufacturing (purifying) a chemical liquid by using a manufacturing device (purification device 30) as an aspect of the chemical liquid manufacturing device will be described.

A chemical liquid purification device 30 shown in FIG. 2 comprises a storage tank 31, a filter unit 32, and a filling device 34 (hereinafter, each of these will be referred to as "unit" as well). These units are connected to each other through a pipe line 33. The pipe line 33 comprises a pump 35 and valves 36 and 37. By operating or opening and closing the pump and the valves, a substance to be purified or a chemical liquid in the purification device 30 can be transferred between the units through the pipe line 33.

The filter unit 32 comprises a filter housing and a filter stored in the filter housing. As the filter, a depth filter, a screen filter, and the like known as filters for chemical liquid purification can be used without particular limitation. The filter may be a pleated filter. The suitable aspect of materials of the filter will be described later.

The storage tank 31 stores a chemical liquid. The storage tank is used, for example, for temporarily storing a chemical liquid (including a chemical liquid (such as a substance to be purified) which is not yet purified or is being purified) in the middle of a purification step or a reaction step that will be described later.

Figure 2:
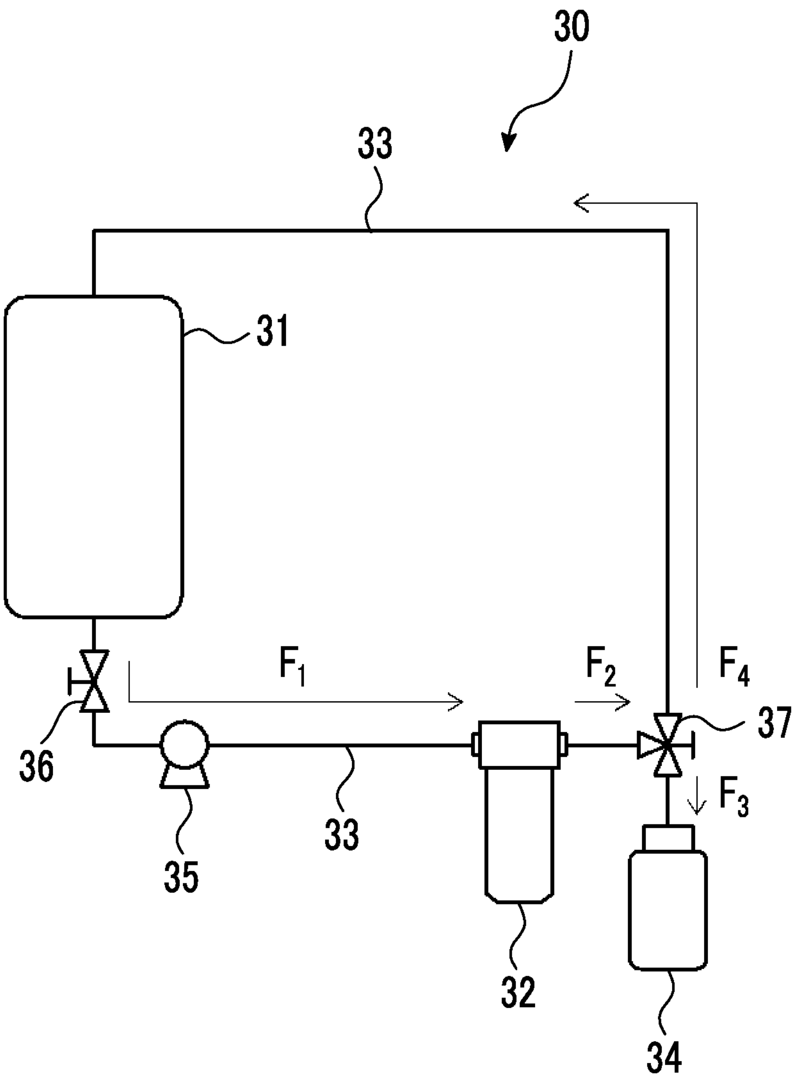
FIG. 2 is a view schematically showing a manufacturing device according to an embodiment of a chemical liquid manufacturing method of an embodiment of the present invention.

The chemical liquid purification device 30 shown in FIG. 2 comprises one filter unit 32. However, the chemical liquid purification device is not limited thereto, and may comprise a plurality of filter units. The filter units may be arranged in series or parallel with the pipe line or arranged in series and parallel with the pipe line.

The filling device 34 has a function of filling up a container with a chemical liquid. The aspect of the filling device 34 is not particularly limited, and a known filling device can be used as the filling device 34.

In the chemical liquid manufacturing device 30, the liquid contact portion of the storage tank 31, the liquid contact portion of the filter unit 32, and the liquid contact portion of the pipe line 33 are constituted with the specific member. That is, the liquid contact portion of each of the storage tank 31, the filter unit 32, and the pipe line 33 is constituted with the specific member. Regarding the filter unit 32, the liquid contact portion of the filter housing is constituted with the specific member.

Hitherto, an aspect has been described in which the entire surface of the liquid contact portion of each of the storage tank, the filter unit (particularly the filter housing), and the pipe line is constituted with the specific member. However, the present invention is not limited to the aspect. For example, a part of the liquid contact portion of the storage tank may be constituted with the specific member. Furthermore, a part of the liquid contact portion of the filter unit (particularly, the filter housing) may be constituted with the specific member. In addition, a part of the liquid contact portion of the pipe line may be constituted with the specific member.

As described above, at least a part of the liquid contact portion of at least one structure selected from the group consisting of the storage tank, the filter unit, and the pipe line may be constituted with the specific member. Especially, the surface area of the liquid contact portion of the above structure constituted with the specific member preferably accounts for 70% or more of the total area of the liquid contact portion, more preferably accounts for 80% or more of the total area of the liquid contact portion, even more preferably accounts for 90% or more of the total area of the liquid contact portion, and particularly preferably accounts for 100% of the total area of the liquid contact portion.

The liquid contact portion of the filter unit will be described using FIG. 3 to FIG. 5.

Figure 3:
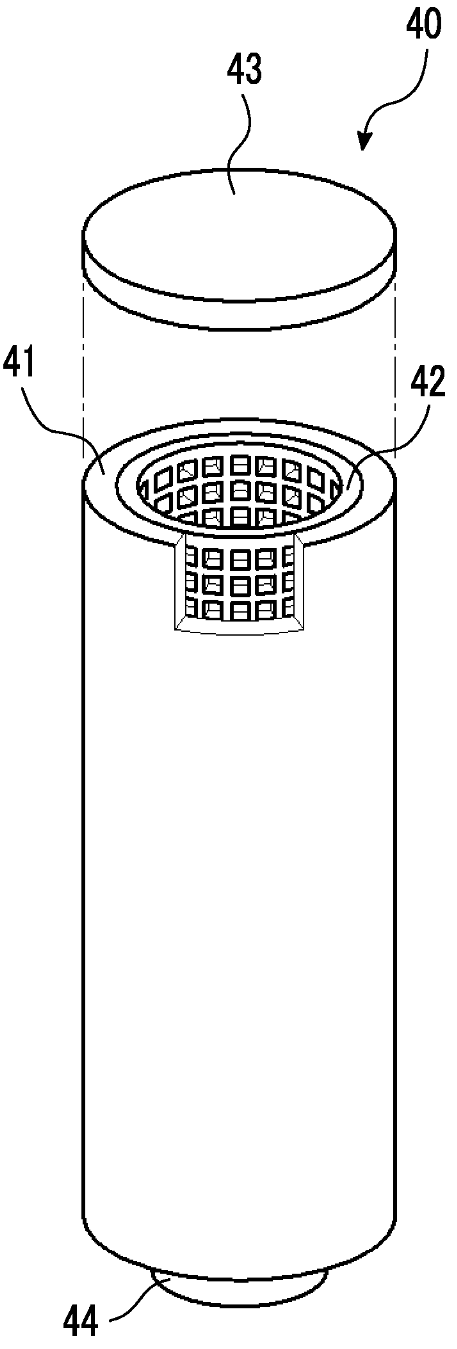
FIG. 3 is a partially exploded perspective view of a typical filter that a filter unit comprises.

FIG. 3 is a partially exploded perspective view of a typical filter that the filter unit comprises. The filter 40 has a cylindrical filter medium 41 and a cylindrical core 42 that supports the filter medium 41 and is disposed on the inside of the cylindrical filter medium. The cylindrical core 42 is in the form of mesh through which a liquid can easily pass. The filter medium 41 and the core 42 form concentric circles. On top of the filter medium 41 and the core 42 that are in the form of a cylinder, a cap 43 is disposed to prevent a liquid from entering the filter from the top. Furthermore, on bottom of the filter medium 41 and the core 42, a liquid outlet 44 is disposed to enable a liquid to be taken out of the inside of the core 42.

A liquid (substance to be purified) flowing in the filter 40 is blocked by the cap 43. Therefore, the liquid passes through the filter medium 41 and the core 42, flows into the inside of the core 42, and flows out of the filter 40 from the liquid outlet 44.

The filter 40 has the core 42 disposed on the inside of the filter medium 41. However, the filter is not limited to this aspect, and may have a protector on the outside of the filter medium 41 (the protector has the same shape as the core 42, but the radius of the protector is different from that of the core 42).

Figure 4:
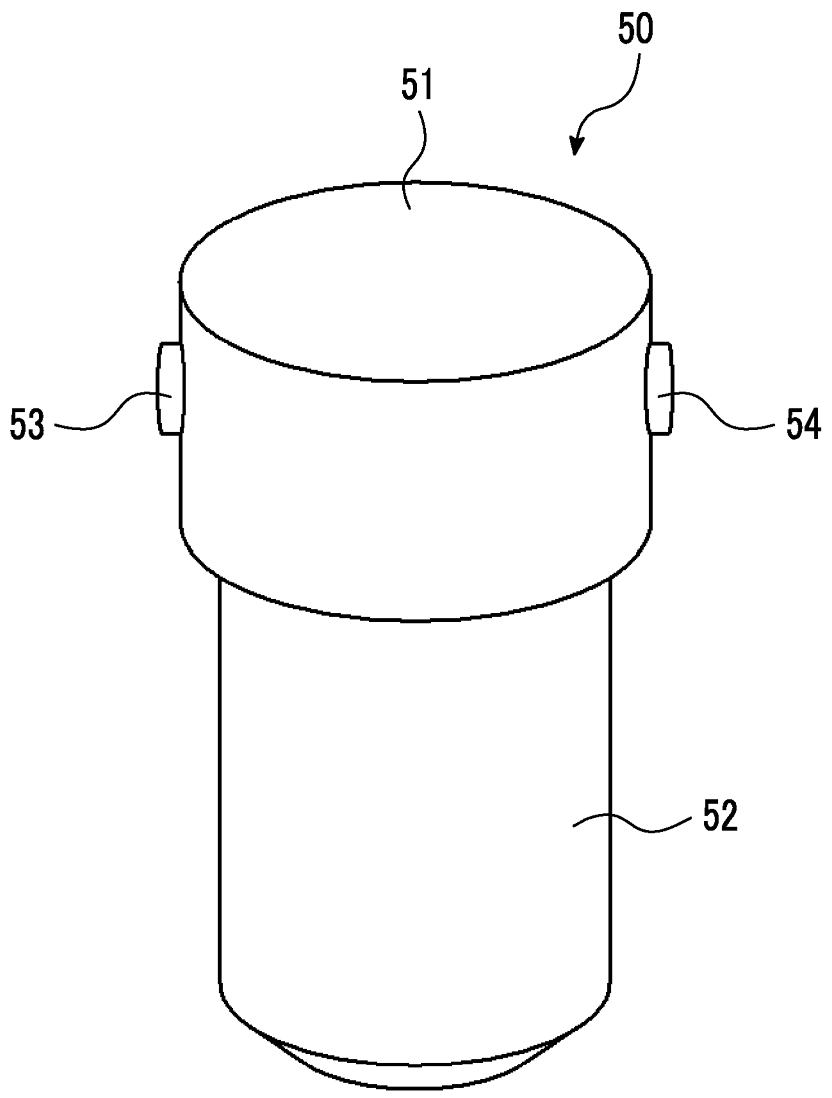
FIG. 4 is a perspective view of a housing that the filter unit comprises.

FIG. 4 is a perspective view of a housing 50 that the filter unit according to an embodiment of the present invention comprises. FIG. 5 is a partial cross-sectional view of the housing. The housing 50 is constituted with a lid 51 and a body 52, and the lid 51 and the body 52 can be fitted with each other. In a case where the lid 51 and the body 52 are fitted with each other, the cavity L is formed in the interior of the housing. The filter 40 can be stored in the cavity L.

The housing 50 has a liquid inlet 53 and a liquid outlet 54. The liquid outlet 44 of the filter 40 and the liquid outlet 54 of the housing are connected to each other by an internal pipe line 55 provided in the interior of the lid 51. The flow of a substance to be purified is indicated by $F_1$. The substance to be purified having flowed into the housing from the liquid inlet 53 flows into the interior of the body 52 through the internal pipe line 56 provided in the interior of the lid 51, passes through the outer surface of the filter 40, the filter medium, and the core, and flows into the inside of the core. In this process, the substance to be purified is purified.

The purified liquid having flowed into the inside of the core passes through the internal pipe line 55 from the liquid outlet of the filter 40, and is taken out of the housing 50 from the liquid outlet 54 (the flow is indicated by $F_2$ in FIG. 2).

Figure 5:
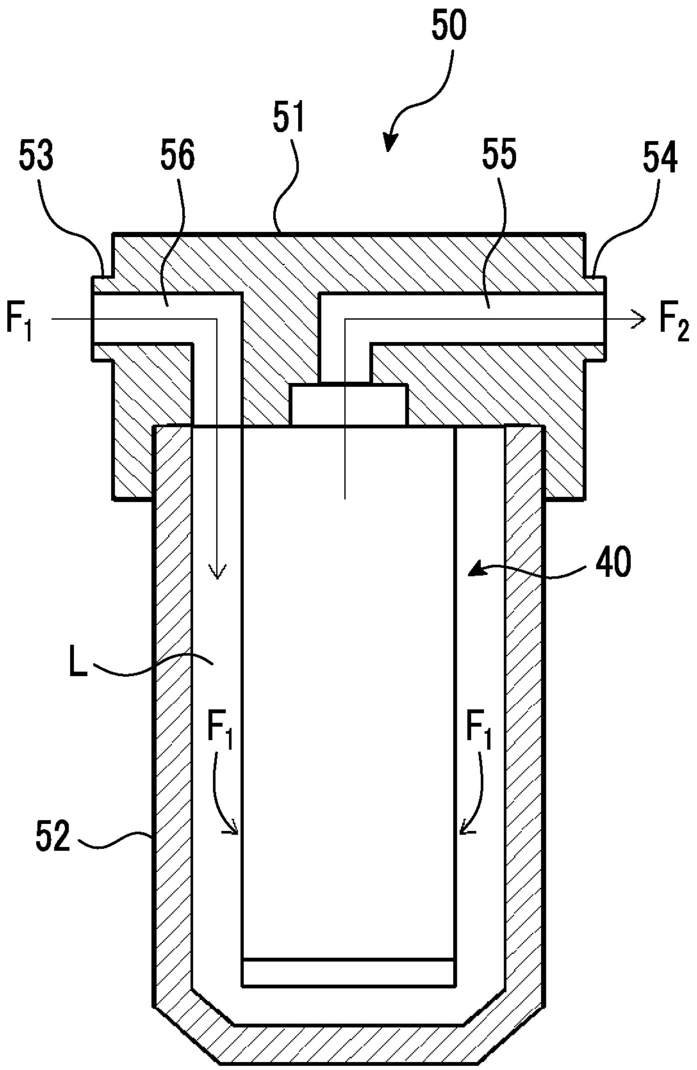
FIG. 5 is a partial cross-sectional view of the housing that the filter unit comprises.

In FIG. 4 and FIG. 5, the liquid inlet 53 and the liquid outlet 54 are disposed on the lid 51 of the housing 50. However, the housing that the filter unit according to the embodiment of the present invention comprises is not limited thereto. The liquid inlet 53 and the liquid outlet 54 can be disposed at any position in the housing 50. At this time, the liquid inlet 53 may be disposed such that the substance to be purified flows into the filter 40 from the outside of the filter 40, and the liquid outlet 54 may be disposed such that the purified substance to be purified is taken out of the core of the filter 40.

In a typical filter unit, "liquid contact portion of the filter unit" is a portion other than the filter 40, and means a site coming into contact with a substance to be purified. Specifically, the inner wall surface of the housing 50, the liquid outlet 44, and the like are the liquid contact portion.

The aspect of the member is as described above.

Hereinafter, a method for manufacturing (purifying) a chemical liquid by using a chemical liquid manufacturing device (purification device 30) will be described. The method for purifying a chemical liquid by using the purification device is not particularly limited. It is preferable that the method includes a step of filtering a substance to be purified by using a filter that a filter unit comprises (purification step).

<Purification Step>

First, the substance to be purified is stored in the storage tank 31.

The shape and the volume of the storage tank are not particularly limited, and can be appropriately changed according to the amount and/or the type of the chemical liquid to be manufactured.

The storage tank may further comprise a stirring blade and the like for stirring the stored substance to be purified and the like. In this case, it is preferable that the liquid contact portion of the stirring blade and the like is also formed of the specific member.

In a case where a valve 36 is opened, by a pump 35, the substance to be purified stored in the storage tank 31 moves through a pipe line 33 along the direction of $F_1$ and is introduced into a filter unit 32. The substance to be purified introduced into the filter unit 32 is purified by passing through the filter medium 41 that the filter 40 comprises. Hereinafter, suitable aspects of the filter that the filter unit comprises will be described.

Filter

As the filter medium the filter comprises, known filter media can be used without particular limitation. The filter may be in the form of any of a depth filter and a screen filter. Furthermore, the filter may be a pleated filter.

As the material of the filter medium, at least one kind of material is preferable which is selected from the group consisting of nylon, polyethylene (including high-density polyethylene and high-molecular-weight polyethylene), polypropylene (including high-density polypropylene and high-molecular-weight polypropylene), polyfluorocarbon (for example, polytetrafluoroethylene: PTFE and the like), cellulose, diatomite, polystyrene, and glass.

In a case where the purification device comprises two or more filter units, the filter medium of the filter that each of the filter units comprises is preferably formed of a hydrophobic material and a hydrophilic material. In the present specification, "hydrophobic material" means that a water contact angle of the surface of the filter medium is equal to or greater than 45° at 25° C., and "hydrophilic material" means that a water contact angle of the surface of the filter medium is less than 45° at 25° C.

In a case where two or more filter units are used, it is preferable that a filter through which the substance to be purified finally passes comprises a filter constituted with a filter medium formed of a hydrophilic material (hereinafter, referred to as "hydrophilic filter" as well). The hydrophilic filter has stronger interaction with impurities contained in the substance to be purified, particularly, metal components, and the metal components are more easily adsorbed onto the hydrophilic filter. Accordingly, the content of metal particles and metal ions in the purified substance to be purified can be easily controlled within a desired range.

In a case where two or more filter units are used, although there is no particular limitation, a differential pressure before and after the passing of the substance to be purified through the filter units (hereinafter, referred to as "filtration differential pressure" as well) is preferably equal to or lower than 250 kPa, and more preferably equal to or lower than 200 kPa. The lower limit thereof is not particularly limited, but is preferably equal to or greater than 50 kPa. In a case where the filtration differential pressure is equal to or lower than 250 kPa, it is possible to prevent an excessively high pressure is applied to the filters, and accordingly, the eluate could be reduced.

The relationship between pore sizes of the filter media is not particularly limited, but it is preferable that the filter media have different pore sizes. It is preferable that the pore size of a filter medium (hereinafter, referred to as "second filter medium" as well) that a filter (hereinafter, referred to as "second filter" as well), through which a substance to be purified passes after passing through a first filter, comprises is the same as or smaller than the pore size of a filter medium (hereinafter, referred to as "first filter medium" as well) that a filter (hereinafter, referred to as "first filter" as well), through which the substance to be purified firstly passes, comprises. In the present specification, as the pore size of a filter medium, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore size: 0.02 μm, critical surface tension: 77 mN/m)" made of polyamide; (manufactured by Pall Corporation Japan), "PE•CLEAN FILTER (pore size: 0.02 μm)" made of high-density polyethylene; (manufactured by Pall Corporation Japan), and "PE•CLEAN FILTER (pore size: 0.01 μm)" made of high-density polyethylene; (manufactured by Pall Corporation Japan).

In a case where a filter medium having a pore size smaller than that of the first filter medium is used as the second filter medium, a ratio between the pore size of the second filter medium and the pore size of the first filter medium (pore size of second filter medium/pore size of first filter medium) is preferably 0.01 to 0.99, more preferably 0.1 to 0.9, and even more preferably 0.2 to 0.9. In a case where the pore size of the second filter medium is within the above range, fine foreign substances mixed into the chemical liquid are more reliably removed.

In a case where the chemical liquid contains an organic solvent, from the viewpoint of inhibiting the increase of metal particles and metal ions in the chemical liquid during the storage of the purified chemical liquid, provided that an interaction radius in the Hansen solubility parameter space derived from the material of the filter medium is R0, and that a radius of a sphere in the Hansen space derived from the organic solvent contained in the chemical liquid is Ra, it is preferable that the chemical liquid and the material of the filter medium are combined such that the chemical liquid and the filter medium have a relationship satisfying a relational expression of $(Ra/R0) \leq 1$, and the chemical liquid is purified by the material of the filter medium satisfying the relational expression. (Ra/R0) is preferably equal to or smaller than 0.98, and more preferably equal to or smaller than 0.95. The lower limit of (Ra/R0) is preferably equal to or greater than 0.5, more preferably equal to or greater than 0.6, and even more preferably 0.7. In a case where Ra/R0 is within the above range, the increase in the content of the metal particles and metal ions in the chemical liquid during long-term storage is inhibited, although the mechanism is unclear.

The combination of the filter medium and the organic solvent is not particularly limited, and examples thereof include those described in US2016/0089622.

The filtering pressure affects the filtering accuracy. Therefore, it is preferable that the pulsation of pressure at the time of filtering is as low as possible.

The filtering speed is not particularly limited. However, in view of obtaining a chemical liquid having further improved effects of the present invention, the filtering speed is preferably equal to or higher than 1.0 L/min/$m^2$, more preferably equal to or higher than 0.75 L/min/$m^2$, and even more preferably equal to or higher than 0.6 L/min/$m^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/$m^2$ although the upper limit usually depends on the endurable differential pressure of the filter. Meanwhile, in a case where the filtering pressure is reduced, it is possible to efficiently reduce the amount of particle-like foreign substances or impurities dissolved in the chemical liquid, and to adjust the pressure according to the purpose.

In view of obtaining a chemical liquid having further improved effects of the present invention, the filtering pressure is preferably 0.001 to 1.0 MPa, more preferably 0.01 to 0.4 MPa, and even more preferably 0.05 to 0.2 MPa. Particularly, in a case where a filter medium having a small pore size is used, by increasing the filtering pressure, it is possible to efficiently reduce the amount of particle-like foreign substances or impurities dissolved in the chemical liquid. In a case where a filter medium having a pore size smaller than 20 nm is used, the filtering pressure is particularly preferably 0.05 to 0.2 MPa.

The smaller the pore size of the filter medium, the lower the filtering speed. However, for example, in a case where a plurality of filters of the same type are connected to each other in parallel, the filtering area is enlarged, and the filtering pressure is reduced. Therefore, in this way, the reduction in the filtering speed can be compensated.

It is more preferable that the purification step has the following steps. In the purification step, each of the following steps may be performed once or plural times. Furthermore, the order of the following steps is not particularly limited.

1. Particle removing step
2. Metal ion removing step
3. Organic impurity removing step Hereinafter, each of the steps will be described.

(Particle Removing Step)

It is preferable that the purification step has a particle removing step. The particle removing step is a step of removing the particles in the chemical liquid containing an organic solvent by using a particle removing filter.

Although there is no particular limitation, the particle removing filter is in the form of a filter comprising a filter medium having a pore size equal to or smaller than 20 nm for example.

The pore size of the filter medium is preferably 1 to 15 nm, and more preferably 1 to 12 nm. In a case where the pore size is equal to or smaller than 15 nm, finer particles can be removed.

In a case where the pore size is equal to or greater than 1 nm, filtering efficiency is improved. Examples of the material of the filter medium that the particle removing filter can comprise include nylon such as 6-nylon and 6,6-nylon, polyethylene, polypropylene, polystyrene, polyimide, polyamide imide, polyfluorocarbon, and the like.

Either or both of polyimide and polyamide imide may have at least one group selected from the group consisting of a carboxy group, a salt-type carboxy group, and a —NH-bond. In view of solvent resistance, polyfluorocarbon, polyimide and/or polyamide imide are excellent. Furthermore, from the viewpoint of adsorbing metal ions, nylon such as 6-nylon and 6,6-nylon are particularly preferable.

In a case where the purification step has the particle removing step, a plurality of particle removing filters may be used. In a case where the plurality of particle removing filters are used, it is preferable that one of the filters is a filter comprising a filter medium having a pore size equal to or greater than 50 nm (for example, a microfiltration membrane for removing fine particles having a pore size equal to or greater than 50 nm). In a case where fine particles such as colloidized impurities are present in the chemical liquid containing an organic solvent, by filtering the chemical liquid containing an organic solvent by using a filter comprising a filter medium having a pore size equal to or greater than 50 nm (for example, a microfiltration membrane for removing fine particles having a pore size equal to or greater than 50 nm) before filtering the chemical liquid containing an organic solvent by using a filter comprising a filter medium having a pore size equal to or smaller than 20 nm (for example, a microfiltration membrane having a pore size equal to or smaller than 20 nm), the filtering efficiency of the filter comprising a filter medium having a pore size equal to or smaller than 20 nm (for example, a microfiltration membrane having a pore size equal to or smaller than 20 nm) is improved, and the particle removing performance is further improved.

(Metal Ion Removing Step)

The purification step may have a metal ion removing step. As the metal ion removing step, a step of passing the chemical liquid containing an organic solvent through a metal ion adsorption filter is preferable.

The metal ion adsorption filter is not particularly limited, and examples thereof include known metal ion adsorption filters.

The metal ion adsorption filter is preferably a filter which can perform ion exchange. Herein, examples of the metal ions to be adsorbed include ions containing the specific metals and ions containing metal other than the specific metals. From the viewpoint of improving the metal ion adsorption performance, it is preferable that the filter medium the metal ion adsorption filter comprises contains an acid group on the surface thereof. Examples of the acid group include a sulfonic acid group, a carboxy group, and the like.

Examples of the material of the filter medium that the metal ion adsorption filter comprises include cellulose, diatomite, nylon, polyethylene, polypropylene, polystyrene, polyfluorocarbon, and the like. From the viewpoint of the metal ion adsorption efficiency, nylon is particularly preferable.

(Organic Impurity Removing Step)

The purification step may have an organic impurity removing step. As the organic impurity removing step, a step of passing chemical liquid containing an organic solvent through an organic impurity adsorption filter is preferable.

The organic impurity adsorption filter is not particularly limited, and examples thereof include known organic impurity adsorption filters.

In view of improving the organic impurity adsorption performance, it is preferable that the filter medium the organic impurity adsorption filter comprises has the skeleton of an organic substance, which can interact with the organic impurities, on the surface thereof (in other words, it is preferable that the surface of the organic impurity adsorption filter is modified with the skeleton of an organic substance which can interact with the organic impurities). Examples of the skeleton of an organic substance which can interact with the organic impurity include a chemical structure which can react with the organic impurities so as to make the organic impurities trapped in the organic impurity adsorption filter. More specifically, in a case where a substance to be purified contains long-chain n-alkyl alcohol (corresponding to a structural isomer in a case where the substance to be purified contains long-chain 1-alkyl alcohol as an organic solvent) as the organic impurities, examples of the skeleton of an organic substance include an alkyl group. Furthermore, in a case where the substance to be purified contains dibutylhydroxytoluene (BHT) as the organic impurities, examples of the skeleton of an organic substance include a phenyl group.

Examples of the material of the filter medium that organic impurity adsorption filter comprises include cellulose supporting active carbon, diatomite, nylon, polyethylene, polypropylene, polystyrene, polyfluorocarbon, and the like.

Furthermore, as the organic impurity adsorption filter, it is possible to use the filters obtained by fixing active carbon to non-woven cloth that are described in JP2002-273123A and JP2013-150979A.

For the organic impurity adsorption filter, in addition to the chemical adsorption described above (adsorption using the organic impurity adsorption filter having the skeleton of an organic substance, which can interact with the organic impurities, on the surface thereof), a physical adsorption method can be used.

For example, in a case where the substance to be purified contains BHT as organic impurities, the structure of BHT is larger than 10 angstroms (=1 nm). Accordingly, in a case where an organic impurity adsorption filter comprising a filter medium having a pore size of 1 nm is used, BHT cannot pass through the pore of the filter medium. That is, by being physically trapped by the filter, BHT is removed from the chemical liquid containing an organic solvent. In this way, for removing organic impurities, not only a chemical interaction but also a physical removing method can be used. Here, in this case, a filter comprising a filter medium having a pore size equal to or greater than 3 nm is used as "particle removing filter", and a filter comprising a filter medium having a pore size less than 3 nm is used as "organic impurity adsorption filter".

(Washing Step: Step of Washing Filter)

It is preferable that the chemical liquid purification method according to the embodiment of the present invention further includes a step of washing the filter. The method for washing the filter is not particularly limited, and examples thereof include a method of immersing the filter in a washing solution, a method of causing a washing solution to flow through the filter, and a method of using these methods in combination.

In a case where the filter is washed, it is easy to control the amount of the component extracted from the filter such that the conditions described above relating to the test liquid are satisfied. As a result, a chemical liquid having a further improved effect of the present invention is obtained.

As the washing solution, known washing solutions can be used without particular limitation. The washing solution is not particularly limited, and examples thereof include water, an organic solvent, and the like. As the organic solvent, for example, organic solvents that the chemical liquid can contain, such as alkylene glycol monoalkyl ether carboxylate, alkylene glycol monoalkyl ether, lactic acid alkyl ester, alkoxyalkyl propionate, cyclic lactone (preferably having 4 to 10 carbon atoms), a ketone compound which may have a ring (preferably having 4 to 10 carbon atoms), alkylene carbonate, alkoxyalkyl acetate, and alkyl pyruvate may be used.

More specifically, examples of the washing solution include propylene glycol monomethyl ether, propylene glycol monomethyl ether acetate, dimethyl sulfoxide, n-methyl pyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, g-butyrolactone, a mixture of these, and the like.

In a case where the valve 37 is opened and the pump 35 is operated, the substance to be purified having undergone purification, which has been purified by passing through the filter unit, flows along the direction of $F_2$ and $F_3$, and then in the filling device 34, the substance to be purified is stored in a container as a chemical liquid.

Furthermore, the valve 37 may be operated such that the substance to be purified having undergone purification flows along the direction of $F_4$ from the direction of $F_2$ and circulates again in the storage tank 31. In this case, the substance to be purified having undergone purification may be purified again in the filter unit, and in this way, a chemical liquid having further improved defect inhibition performance is obtained.

Although the liquid contact portion of the filling device 34 is not particularly limited, it is preferable that at least a part of the liquid contact portion is formed of the member according to the embodiment of the present invention (the surface area of the liquid contact portion formed of the member according to the embodiment of the present invention preferably accounts for 70% or more of the total surface area of the liquid contact portion, more preferably accounts for 80% or more of the total surface area of the liquid contact portion, even more preferably accounts for 90% or more of the total surface area of the liquid contact portion, and particularly preferably accounts for 100% of the total surface area of the liquid contact portion).

[Other Embodiments of Manufacturing Device]

Figure 6:
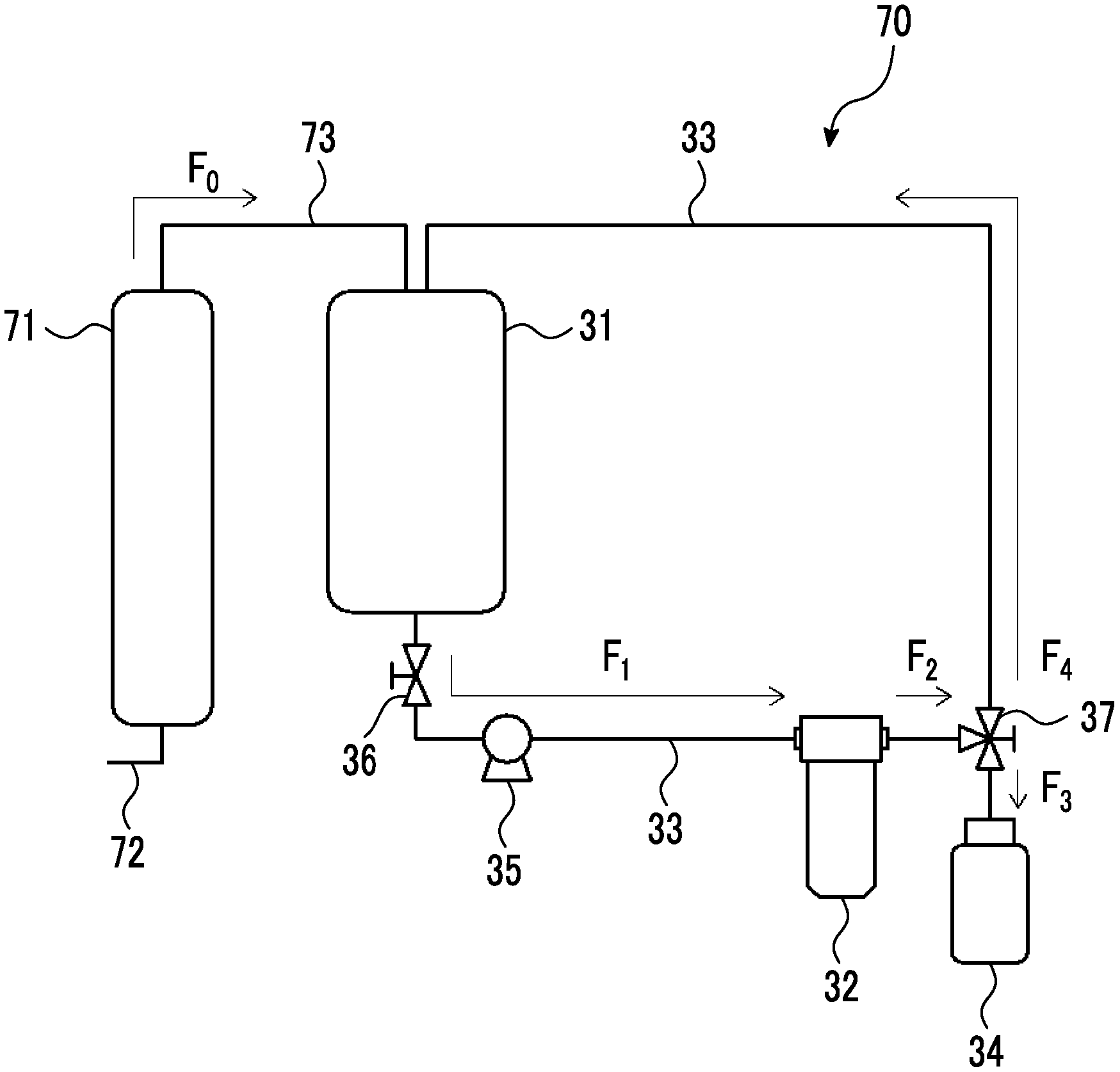
FIG. 6 is a view schematically showing a manufacturing device according to an embodiment of a chemical liquid manufacturing method of an embodiment of the present invention.

Other embodiments of the chemical liquid manufacturing device will be described using FIG. 6. The manufacturing device (purification device 70) is a purification device in which a distillation column 71 is connected to the storage tank 31 of the purification device 30 shown in FIG. 3 through a pipe line 73.

In the purification device 70, a substance to be purified is introduced into the distillation column 71 from the bottom of the distillation column 71 through a pipe line 72. The substance to be purified introduced into the distillation column 71 is distilled. The substance to be purified having undergone distillation flows along the direction of $F_0$ and is introduced into the storage tank 31. The purification step performed thereafter is as described above.

In the chemical liquid purification device 70, the liquid contact portion of the distillation column 71, the liquid contact portion of the pipe line 73, the liquid contact portion of the storage tank 31, the liquid contact portion of the filter unit 32, and the liquid contact portion of the pipe line 33 are constituted with the specific member. That is, the liquid contact portion of each of the distillation column 71, the pipe line 73, the storage tank 31, the filter unit 32, and the pipe line 33 is constituted with the specific member. Regarding the filter unit 32, the liquid contact portion of the filter housing is constituted with the specific member.

Hitherto, an aspect has been described in which the entire surface of the liquid contact portion of each of the distillation column, the storage tank, the filter unit (particularly the filter housing), and the pipe line is constituted with the specific member. However, the present invention is not limited to the aspect. For example, a part of the liquid contact portion of the distillation column may be constituted with the specific member. A part of the liquid contact portion of the storage tank may be constituted with the specific member. Furthermore, a part of the liquid contact portion of the filter unit (particularly, the filter housing) may be constituted with the specific member. In addition, a part of the liquid contact portion of the pipe line may be constituted with the specific member.

As described above, at least a part of the liquid contact portion of at least one structure selected from the group consisting of the distillation column, the storage tank, the filter unit, and the pipe line may be constituted with the specific member. Especially, the area of the liquid contact portion of the above structure constituted with the specific member preferably accounts for 70% or more of the total area of the liquid contact portion, more preferably accounts for 80% or more of the total area of the liquid contact portion, even more preferably accounts for 90% or more of the total area of the liquid contact portion, and particularly preferably accounts for 100% of the total area of the liquid contact portion.

The method for purifying a chemical liquid by using the chemical liquid manufacturing device according to the above embodiment may have a distillation step of distilling the substance to be purified by using the distillation column, in addition to the chemical liquid purification method described above. Alternatively, in this method, only the distillation step may be performed, and the purification method using the filter unit may not be performed.

Figure 7:
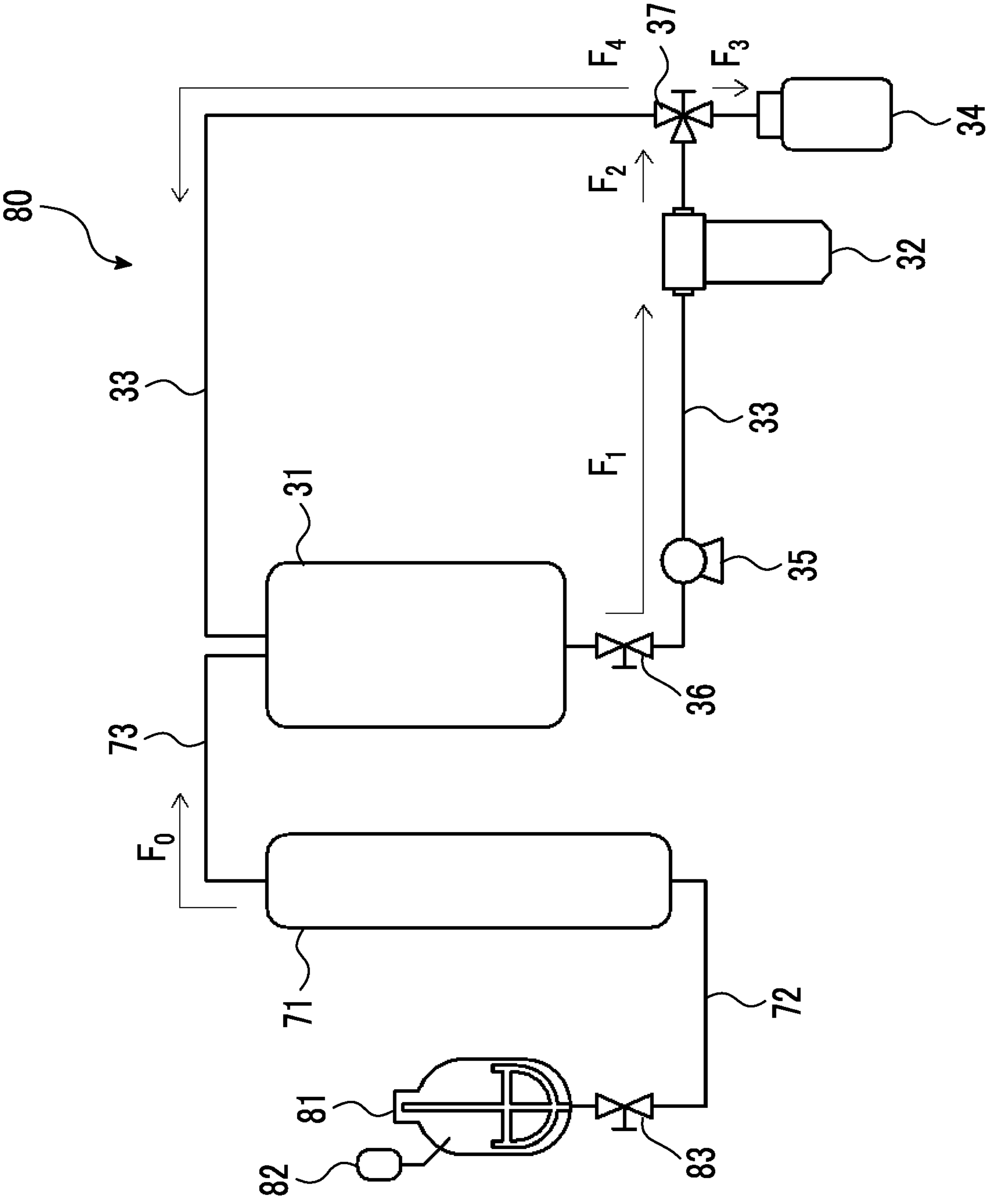
FIG. 7 is a view schematically showing a manufacturing device according to an embodiment of the chemical liquid manufacturing method of the embodiment of the present invention.

The manufacturing device according to an embodiment of the present invention will be described using FIG. 7. FIG. 7 is a schematic view of the chemical liquid manufacturing device. In a chemical liquid manufacturing device 80, a reactor 81 comprising a raw material inlet 82 (these will be collectively referred to as "reaction portion" as well) is connected to the distillation column 71 of the purification device 70 illustrated in FIG. 6 through a pipe line 72 comprising a valve 83. The chemical liquid manufacturing device shown in FIG. 7 has the distillation column 71, but the manufacturing device is not limited thereto and may not have the distillation column 71. In this case, for example, the manufacturing device may have an aspect in which the storage tank 31 of the purification device 30 shown in FIG. 2 and the reactor 81 comprising the raw material inlet 82 are connected to each other through the pipe line 72 comprising the valve 83.

Furthermore, the manufacturing device 80 may comprise, before or in the middle of the reaction portion, a storage tank for storing raw materials for obtaining a chemical liquid as a reactant by being reacted with each other. The raw materials stored in the storage tank for storing the raw materials means not only starting materials but also intermediate materials generated in the manufacturing process. A part of the liquid contact portion of such a storage tank may be constituted with the specific member (the area of the liquid contact portion constituted with the specific member preferably accounts for 70% or more of the total area of the liquid contact portion, more preferably accounts for 80% or more of the total area of the liquid contact portion, even more preferably accounts for 90% or more of the total area of the liquid contact portion, and particularly preferably accounts for 100% of the total area of the liquid contact portion).

The reaction portion has a function of obtaining a reactant containing an organic solvent by reacting raw materials supplied from the raw material inlet 82 (if necessary, in the presence of a catalyst) in the reactor 81.

Although the liquid contact portion of the reactor 81 and the raw material inlet 82 is not particularly limited, it is preferable that at least a part of the liquid contact portion is constituted with the specific member.

In the chemical liquid manufacturing device 80, the liquid contact portion of the reactor 81, the liquid contact portion of the pipe line 72, the liquid contact portion of the distillation column 71, the liquid contact portion of the pipe line 73, the liquid contact portion of the storage tank 31, the liquid contact portion of the filter unit 32, and the liquid contact portion of the pipe line 33 are constituted with the specific member. That is, the liquid contact portion of each of the reactor 81, the pipe line 72, the distillation column 71, the pipe line 73, the storage tank 31, the filter unit 32, and the pipe line 33 is constituted with the specific member. Regarding the filter unit 32, the liquid contact portion of the filter housing is constituted with the specific member.

Hitherto, an aspect has been described in which the entire surface of the liquid contact portion of each of the reactor, the distillation column, the storage tank, the filter unit (particularly the filter housing), and the pipe line is constituted with the specific member. However, the present invention is not limited to the aspect. For example, a part of the liquid contact portion of the reactor may be constituted with the specific member. A part of the liquid contact portion of the distillation column may be constituted with the specific member. A part of the liquid contact portion of the storage tank may be constituted with the specific member. Furthermore, a part of the liquid contact portion of the filter unit (particularly, the filter housing) may be constituted with the specific member. In addition, a part of the liquid contact portion of the pipe line may be constituted with the specific member.

As described above, at least a part of the liquid contact portion of at least one structure selected from the group consisting of the reactor, the distillation column, the storage tank, the filter unit, and the pipe line may be constituted with the specific member. Especially, the area of the liquid contact portion of the above structure constituted with the specific member preferably accounts for 70% or more of the total area of the liquid contact portion, more preferably accounts for 80% or more of the total area of the liquid contact portion, even more preferably accounts for 90% or more of the total area of the liquid contact portion, and particularly preferably accounts for 100% of the total area of the liquid contact portion.

<Chemical Liquid Manufacturing Method>

It is preferable that the chemical liquid is manufactured using the chemical liquid manufacturing device comprising at least one unit selected from the group consisting of the reactor, the distillation column, the filter unit, the storage tank, and the pipe line in which at least a part of a liquid contact portion is formed of the specific member. The chemical liquid manufacturing device is as described above. Examples of the manufactured chemical liquid include the same chemical liquids as those exemplified above as the chemical liquid to be stored in the aforementioned chemical liquid storage body.

The method for manufacturing a chemical liquid by using the manufacturing device described above is not particularly limited, but it is preferable that the method has the following steps.

Reaction Step

Purification Step

The purification step is the same as the aspect described above. Therefore, hereinafter, the reaction step will be described without describing the purification step.

The reaction step is a step of obtaining a reactant by reacting raw materials.

The reactant is not particularly limited, and examples thereof include the aforementioned substance to be purified containing an organic solvent. That is, for example, the reactant is obtained by a step of synthesizing an organic solvent so as to obtain a substance to be purified containing an organic solvent.

As the method for obtaining the reactant, known methods can be used without particular limitation. Examples thereof include a method of obtaining a reactant by reacting one raw material or a plurality of raw materials in the presence of a catalyst.

More specifically, examples thereof include a step of obtaining butyl acetate by reacting acetic acid and n-butanol in the presence of sulfuric acid, a step of obtaining 1-hexanol by reacting ethylene, oxygen, and water in the presence of $Al(C_2H_5)_3$, a step of obtaining 4-methyl-2-pentanol by reacting cis-4-methyl-2-pentene in the presence of Diisopinocamphenyl borane (Ipc2BH), a step of obtaining propylene glycol 1-monomethyl ether 2-acetate (PGMEA) by reacting propylene oxide, methanol, and acetic acid in the presence of sulfuric acid, a step of obtaining isopropyl alcohol (IPA) by reacting acetone and hydrogen in the presence of copper oxide-zinc oxide-aluminum oxide, a step of obtaining ethyl lactate by reacting lactic acid and ethanol, and the like.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

For preparing chemical liquids of examples and comparative examples, the handling of containers, the preparation, filling, storage, and analytical measurement of chemical liquids were all performed in a clean room of a level satisfying ISO class 2 or 1. In order to improve the measurement accuracy, in measuring the content of an organic compound and the content of a metal component, in a case where the content of the organic compound or metal component was found to be equal to or smaller than a detection limit by general measurement, the chemical liquid was concentrated for the measurement, and the content was calculated by converting the concentration into the concentration of the solution not yet being concentrated.

Unless otherwise specified, the instruments and the like used in test have been thoroughly washed in advance.

Example X

[Container]

[Preparation of Container]

A surface treatment was performed on containers formed of SUS304, SUS316, or SUS316L under the conditions shown in Table 1 that will be shown below. Specifically, the pre-treatment in Table 1 was performed, then electropolishing was performed if necessary, and either or both of a post-treatment 1 and a post-treatment 2 were additionally performed.

The electrolytic solution used in the electropolishing is a mixed solution of 85% by mass phosphoric acid:98% by mass sulfuric acid=4:3 (volume ratio).

In a case where either or both of annealing and an acid treatment are performed as a post-treatment, they are performed under the following conditions.

Annealing (800° C., 1 hour, in Ar atmosphere containing 10 mass ppm of water)

Here, in Example 08, the annealing time was doubled (2 hours).

Acid Treatment (35% by mass hydrochloric acid:69% by mass nitric acid:50% by mass hydrofluoric acid:98% by mass sulfuric acid=5:1:1:13 (volume ratio), treatment temperature: 60° C.)

TABLE 1

| | | Surface treatment method | | | | | |
|---|---|---|---|---|---|---|---|
| | | | Electropolishing | | | | |
| | Base material | Pre-treatment | Liquid temperature ° C. | Current density A/dm$^2$ | Treatment time min | Post-treatment 1 | Post-treatment 2 |
| Example 01 | SUS316L | Buffing with #400 abrasive | 50 | 10 | 120 | Annealing | Acid treatment |
| Example 02 | SUS316L | Buffing with #400 abrasive | 50 | 10 | 60 | Annealing | N/A |
| Example 03 | SUS316L | Buffing with #400 abrasive | 50 | 10 | 60 | Annealing | N/A |
| Example 04 | SUS316L | Buffing with #400 abrasive | 50 | 10 | 60 | Annealing | N/A |
| Example 05 | SUS316L | Buffing with #400 abrasive | 50 | 10 | 60 | Annealing | N/A |
| Example 06 | SUS316L | Buffing with #400 abrasive | 50 | 10 | 60 | Annealing | N/A |
| Example 07 | SUS316L | Magnetic fluid polishing | 50 | 10 | 60 | Annealing | N/A |
| Example 08 | SUS316L | Buffing with #400 abrasive | 50 | 10 | 60 | Annealing | |
| Example 09 | SUS316L | Buffing with #400 abrasive | 50 | 10 | 60 | Annealing | N/A |
| Example 10 | SUS316L | Buffing with #400 abrasive | 40 | 10 | 30 | Annealing | N/A |
| Example 11 | SUS316L | N/A | 50 | 10 | 60 | Annealing | N/A |
| Example 12 | SUS316L | N/A | 40 | 10 | 30 | Annealing | N/A |
| Example 13 | SUS316L | Buffing with #400 abrasive | 50 | 10 | 10 | Annealing | N/A |
| Example 14 | SUS316L | N/A | 40 | 10 | 10 | Annealing | N/A |
| Example 15 | SUS316L | Buffing with #400 abrasive | | N/A | | Annealing | Acid treatment |
| Example 16 | SUS316L | Buffing with #400 abrasive | 40 | 10 | 5 | Annealing | N/A |

TABLE 1-continued

| | | Surface treatment method | | | | | |
|---|---|---|---|---|---|---|---|
| | | | Electropolishing | | | | |
| | Base material | Pre-treatment | Liquid temperature ° C. | Current density A/dm$^2$ | Treatment time min | Post-treatment 1 | Post-treatment 2 |
| Example 17 | SUS316L | Buffing with #400 abrasive | 50 | 10 | 5 | Annealing | N/A |
| Example 18 | SUS316L | Buffing with #400 abrasive | 50 | 10 | 30 | Annealing | N/A |
| Example 19 | SUS316L | Buffing with #400 abrasive | 50 | 10 | 30 | Annealing | N/A |
| Example 19-2 | SUS316L | Buffing with #400 abrasive | 50 | 10 | 30 | Annealing | N/A |
| Example 20 | SUS316L | Buffing with #400 abrasive | 50 | 10 | 30 | Annealing | N/A |
| Example 21 | SUS316L | Buffing with #400 abrasive | 50 | 10 | 30 | Annealing | N/A |
| Example 22 | SUS316L | Buffing with #400 abrasive | 50 | 10 | 30 | Annealing | N/A |
| Example 23 | SUS316L | Buffing with #400 abrasive | 50 | 10 | 30 | Annealing | N/A |
| Example 24 | SUS316L | Buffing with #400 abrasive | 50 | 10 | 30 | Annealing | N/A |
| Example 25 | SUS316L | Buffing with #400 abrasive | 50 | 10 | 30 | Annealing | N/A |
| Example 26 | SUS304 | Buffing with #400 abrasive | 50 | 10 | 30 | Annealing | N/A |
| Example 27 | SUS316 | Buffing with #400 abrasive | 50 | 10 | 30 | Annealing | N/A |
| Example 28 | SUS316L | Buffing with #1000 abrasive | 50 | 10 | 60 | Annealing | N/A |
| Example 29 | SUS316L | Buffing with #1000 abrasive | 50 | 10 | 120 | Annealing | N/A |
| Comparative Example 01 | SUS316L | N/A | 70 | 20 | 120 | N/A | Acid treatment |
| Comparative Example 02 | SUS316L | N/A | | N/A | | N/A | N/A |
| Comparative Example 03 | SUS316L | Buffing with #400 abrasive | | N/A | | N/A | N/A |
| Comparative Example 04 | SUS316L | Buffing with #400 abrasive | | N/A | | N/A | N/A |
| Comparative Example 05 | SUS316L | Buffing with #400 abrasive | | N/A | | N/A | N/A |
| Comparative Example 06 | SUS316L | Buffing with #400 abrasive | | N/A | | N/A | N/A |
| Comparative Example 07 | SUS316L | Buffing with #400 abrasive | | N/A | | N/A | N/A |
| Comparative Example 08 | SUS316L | Buffing with #400 abrasive | | N/A | | N/A | N/A |
| Comparative Example 09 | SUS316L | Buffing with #400 abrasive | | N/A | | N/A | N/A |
| Comparative Example 10 | SUS316L | Buffing with #400 abrasive | | N/A | | N/A | N/A |
| Comparative Example 11 | SUS316L | Buffing with #400 abrasive | | N/A | | N/A | N/A |
| Comparative Example 12 | SUS316L | Buffing with #100 abrasive | 50 | 10 | 30 | Annealing | N/A |

[Measurement of Container]

<Cr/Fe Ratio>

The Cr/Fe ratio within the inner wall of each container (member) was measured by the method described above in the present specification. As ESCA, ESCA-3400 manufactured by Shimadzu Corporation was used.

In all of the containers, while the measurement was being continued to a depth of 10 nm, the Cr/Fe ratio did not change as the depth changed. The Cr/Fe ratio at a depth of 10 nm was adopted as a Cr/Fe ratio of the base material of each container.

<Average Surface Roughness>

The average surface roughness (Ra) of the surface of the liquid contact portion of the prepared container was measured and determined using an atomic force microscope (AFM) NanoScope 4A manufactured by Veeco Instruments Inc. in Japan.

[Test]

The following chemical liquid was stored in each of the containers having undergone a surface treatment, thereby preparing chemical liquid storage bodies.

The chemical liquid was stored in each container in such an amount that the void fraction was 20% by volume, and the void portion was filled with 99.9999% by volume of nitrogen.

All of chemical liquids B to H were used after being purified such that the content of a high-boiling-point organic component was 10,000 mass ppt with respect to the mass of each of the chemical liquids. Furthermore, regarding a chemical liquid A, a chemical liquid was prepared which was purified such that the content of a high-boiling-point organic component was 0.01 mass ppt with respect to the mass of the chemical liquid, and a predetermined amount of the unpurified chemical liquid A was added thereto such that the content of a high-boiling-point organic component in the chemical liquid reached a desired amount.

After the chemical liquid was concentrated, the content of the high-boiling-point organic component in the chemical liquid was measured by gas chromatography mass spectrometry (GC/MS).

A: propylene glycol monomethyl ether acetate (PGMEA)

B: PGMEA/PGME=7:3 (mixed solution of propylene glycol monomethyl ether acetate/propylene glycol monomethyl ether=7/3 (mass ratio))

C: Butyl acetate (nBA)

D: Cyclohexanone

E: Isopropanol (IPA)

F: MIBC (4-methyl-2-pentanol)

G: Ethyl lactate

H: PGMEA/PC=9:1 (mixed solution of propylene glycol monomethyl ether acetate/propylene carbonate=9/1 (mass ratio))

Alkaline liquid: 2.38% by mass aqueous tetramethylammonium hydroxide (TMAH) solution <Change in Content of Metal Component>

Each container was filled with each chemical liquid and then stored for 12 months in an environment at 40° C.

Before and after the storage, the content of particle-like Fe, Cr, or Ni (specific metal particles) having a particle diameter larger than 25 nm in the chemical liquid was measured, and the storage-induced change in the content of the specific metal particles was investigated and evaluated according to the following standard.

In all of the chemical liquids, the content of the specific metal component was equal to or smaller than 10 mass ppt before the storage treatment.

A: The increase was equal to or smaller than 5 mass ppt.

B: The increase was greater than 5 mass ppt and equal to or smaller than 10 mass ppt.

C: The increase was greater than 10 mass ppt and equal to or smaller than 100 mass ppt.

D: The increase was greater than 100 mass ppt and equal to or smaller than 300 mass ppt.

E: The increase was greater than 300 mass ppt.

The content of the specific metal particles in the chemical liquid was measured by a method using SP-ICP-MS.

The used devices are as follows.

Manufacturer: PerkinElmer

Model: NexION350S

The following analysis software was used for analysis.

Syngistix nano application module dedicated for "SP-ICP-MS"

Syngistix for ICP-MS software

<Evaluation of Defect Inhibition Properties of Chemical Liquid>

By using the chemical liquid that had been stored for 12 months in an environment at 40° C. after being filled into the container, the following evaluation was performed.

(Residue Defect Inhibition)

For evaluating residue defects, by using the principle described in JP2009-188333A and the method described in paragraphs "0015" to "0067" in JP2009-188333A, the number of defects having a diameter of 0.5 to 17 nm was detected as residue defects. That is, by a chemical vapor deposition (CVD) method, a $SiO_X$ layer was formed on a silicon wafer (Bare-Si) substrate having a diameter of 300 mm. Then, a chemical liquid layer covering this layer was formed. Thereafter, a method was used in which the composite layer including the $SiO_X$ layer and the chemical liquid layer with which the $SiO_X$ layer was coated was subjected to dry etching, the obtained projections were irradiated with light, the scattered light was detected, the volume of the projections was calculated from the scattered light, and the particle size of the particles was calculated from the volume of the projections.

A The number of defects was equal to or smaller than 100/wafer.

B The number of defects was greater than 100/wafer and equal to or smaller than 200/wafer.

C The number of defects was greater than 200/wafer and equal to or smaller than 2,000/wafer.

D The number of defects was greater than 2,000/wafer and equal to or smaller than 10,000/wafer.

E The number of defects was greater than 10,000/wafer.

(Stain-Like Defect Inhibition Properties)

A silicon wafer (Bare-Si) having a diameter of about 300 mm was spin-coated with the chemical liquid of Example 1, thereby obtaining a wafer coated with a chemical liquid. The used device was Lithius ProZ, and the coating conditions were as follows.

Amount of chemical liquid used for coating: 2 ml

Rotation speed of silicon wafer during coating: 2,200 rpm, 60 sec

Then, by using a wafer inspection device "SP-5" manufactured by KLA-Tencor Corporation and a fully automatic defect review/classification device "SEMVision G6" manufactured by Applied Materials, Inc., among the defects having a size equal to or greater than 19 nm existing on the entire surface of the wafer, the defects increased after coating was observed to check the shape thereof, and the foreign substances that were not in the form of particles were regarded as stain-like foreign substances.

The chemical liquid evaluated as levels A to C are unproblematic for practical use.

A The number of defects was equal to or smaller than 1/wafer.

B The number of defects was greater than 1/wafer and equal to or smaller than 10/wafer.

C The number of defects was greater than 10/wafer and equal to or smaller than 100/wafer.

E The number of defects was greater than 100/wafer.

(Bridge Defect Inhibition Properties)

Each chemical liquid was used for the formation of a pattern using a resist composition, and the bridge defect inhibition performance of the chemical liquid was evaluated.

First, the resist composition used will be described.

Resist Composition

The resist composition was obtained by mixing together the following components.

Acid-decomposable resin (resin represented by the following formula (weight-average molecular weight (Mw) 7,500): the numerical value described in each repeating unit means mol %): 100 parts by mass

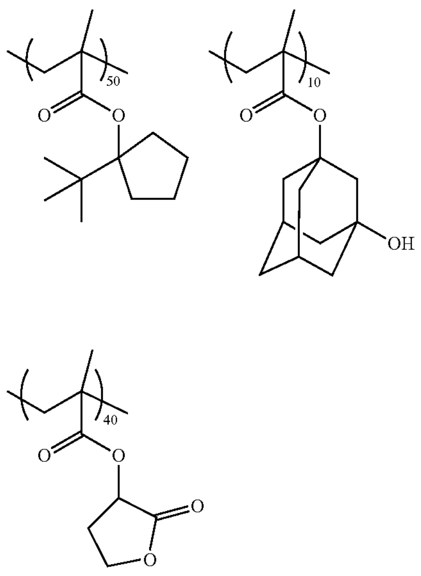

The following photoacid generator: 8 parts by mass

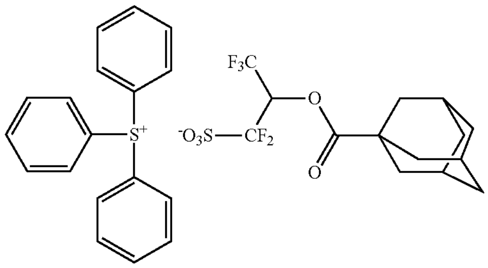

The following quencher: 5 parts by mass (the mass ratio was 0.1:0.3:0.3:0.2 in this order from the left). Among the following quenchers, a polymer-type quencher is a quencher at a mass ratio of 0.2, which has a weight-average molecular weight of 5,000 (Mw, measured by GPC and expressed in terms of polystyrene). The numerical value described in each repeating unit means molar ratio.

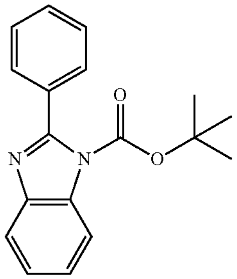

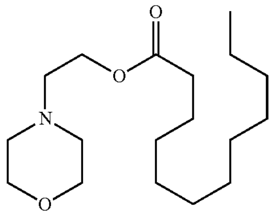

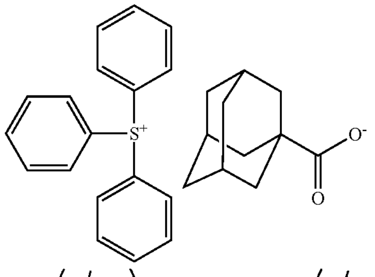

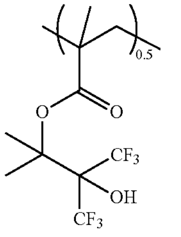

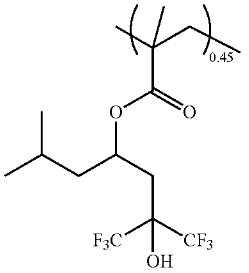

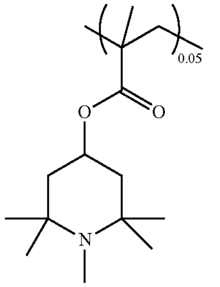

The following hydrophobic resin: 4 parts by mass (mass ratio was (1):(2)=0.5:0.5). Among the following hydrophobic resins, the hydrophobic resin represented by Formula (1) has a weight-average molecular weight of 7,000 (Mw, measured by GPC and expressed in terms of polystyrene, the same is true of the following description), and the hydrophobic resin represented by Formula (2) has a weight-average molecular weight (Mw) of 8,000. In each of the hydrophobic resins, the numerical value described in each repeating unit means molar ratio.

(1)

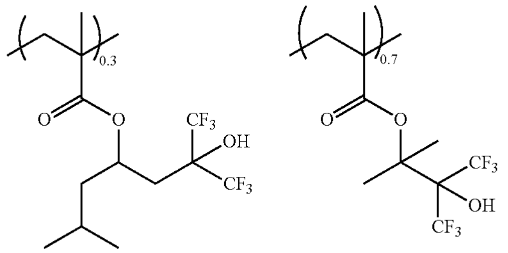

(2)

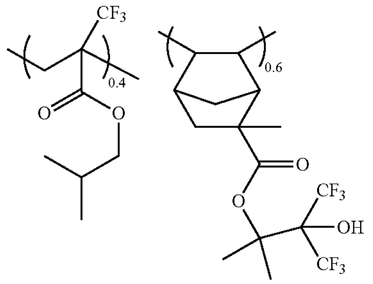

Solvent:

Propylene glycol monomethyl ether acetate (PGMEA): 3 parts by mass

Cyclohexanone: 600 parts by mass

γ-Butyrolactone (γ-BL): 100 parts by mass

Test Method

Next, the test method will be described. First, a silicon wafer having a diameter of about 300 mm was pre-wet with each chemical liquid, and then the pre-wet silicon wafer was spin-coated with the resist composition described above. Thereafter, the wafer was heated and dried at 150° C. for 90 seconds on a hot plate, thereby forming a resist film having a thickness of 9 μm.

For the resist film, in order that a pattern having a line width of 30 nm and a space width of 30 nm was formed after reduction projection exposure and development, by using an ArF excimer laser scanner (manufactured by ASML, PAS5500/850C, wavelength: 248 nm), pattern exposure was performed under the exposure conditions of NA=0.60 and σ=0.75 through a mask having a line-and-space pattern. After being irradiated, the resist film was baked for 60 seconds at 120° C. Subsequently, the resist film was developed, rinsed, and then baked for 60 seconds at 110° C., thereby forming a pattern having a line width of 30 nm and a space width of 30 nm.

By using a critical dimension scanning electron microscope (critical dimension SEM, CG4600, manufactured by Hitachi High-Technologies Corporation), 100 shots of the pattern were captured. The number of defects in the form of a crosslink between patterns (bridge defects) was counted, and the number of defects per unit area was determined.

Note that the smaller the number of defects in the form of a crosslink between patterns, the better the bridge defect inhibition properties of the chemical liquid. The bridge defect inhibition properties of other chemical liquids were evaluated by the same method as that described above.

Basically, the liquid of Example 20 was used for pre-wetting, the liquid of Example 19-2 was used for development, and the liquid of Example 19 was used for rinsing. The chemical liquid as an evaluation target was evaluated by being used in the step described in the column of "Process" in the tables of examples.

For example, in Example 01, a pattern was formed using the chemical liquid of Example 01 as a prewet solution, the chemical liquid of Example 19-2 as a developer, and the chemical liquid of Example 19 as a rinsing solution, and the number of bridge defects in the obtained pattern was counted.

Here, in a case where an alkaline liquid (the chemical liquid of Example 25 or the chemical liquid of Comparative Example 11) was used as a developer, ultrapure water was used as a rinsing solution.

A: The number of bridge defects was less than $2/cm^2$.

B: The number of bridge defects was equal to or greater than $2/cm^2$ and less than $5/cm^2$.

C: The number of bridge defects was equal to or greater than $5/cm^2$ and less than $10/cm^2$.

D: The number of bridge defects was equal to or greater than $10/cm^2$ and less than $15/cm^2$.

E: The number of bridge defects was equal to or greater than $15/cm^2$.

Table 2 shows the surface structure of each container and the stored chemical liquid.

In addition, Table 3 shows the results of the test using the chemical liquid after storage.

In Table 3, the column of "Content of high-boiling-point organic component" shows the content (mass ppt) of the high-boiling-point organic component with respect to the mass of the chemical liquid.

TABLE 2

| | Container | | | | | | Chemical liquid | |
|---|---|---|---|---|---|---|---|---|
| | | Cr/Fe ratio | | | | | | |
| | Base material | Surface | Maximum value at a depth equal to or smaller than 3 nm | Maximum value at a depth greater than 3 nm and equal to or smaller than 10 nm | Base material (depth 10 nm) | Average surface roughness Ra [nm] | Type of liquid | Content of high-boiling-point component |
| Example 01 | SUS316L | 2.8 | 2.8 | 0.4 | 0.3 | 2 | Solvent A | 10,000 |
| Example 02 | SUS316L | 1.5 | 1.5 | 0.3 | 0.3 | 1 | Solvent A | 0.01 |
| Example 03 | SUS316L | 1.5 | 1.5 | 0.3 | 0.3 | 1 | Solvent A | 0.1 |
| Example 04 | SUS316L | 1.5 | 1.5 | 0.3 | 0.3 | 1 | Solvent A | 10,000 |
| Example 05 | SUS316L | 1.5 | 1.5 | 0.3 | 0.3 | 1 | Solvent A | 10,0000 |
| Example 06 | SUS316L | 1.5 | 1.5 | 0.3 | 0.3 | 1 | Solvent A | 500,000 |
| Example 07 | SUS316L | 1.5 | 1.5 | 0.3 | 0.3 | 1 | Solvent A | 10,000 |
| Example 08 | SUS316L | 1.5 | 1.5 | 0.3 | 0.3 | 1 | Solvent A | 10,000 |
| Example 09 | SUS316L | 1.5 | 1.5 | 0.3 | 0.3 | 2 | Solvent A | 10,000 |
| Example 10 | SUS316L | 1.1 | 1.1 | 0.3 | 0.3 | 3 | Solvent A | 10,000 |
| Example 11 | SUS316L | 1.0 | 1.3 | 0.3 | 0.3 | 1 | Solvent A | 10,000 |
| Example 12 | SUS316L | 0.9 | 0.9 | 0.3 | 0.3 | 2 | Solvent A | 10,000 |
| Example 13 | SUS316L | 0.7 | 0.7 | 0.3 | 0.3 | 2 | Solvent A | 10,000 |
| Example 14 | SUS316L | 0.6 | 0.8 | 0.3 | 0.3 | 3 | Solvent A | 10,000 |
| Example 15 | SUS316L | 0.6 | 0.6 | 0.3 | 0.3 | 5 | Solvent A | 10,000 |
| Example 16 | SUS316L | 0.4 | 0.5 | 0.3 | 0.3 | 10 | Solvent A | 10,000 |
| Example 17 | SUS316L | 0.5 | 0.5 | 0.3 | 0.3 | 10 | Solvent A | 10,000 |
| Example 18 | SUS316L | 1.5 | 1.5 | 0.3 | 0.3 | 1 | Solvent B | 10,000 |
| Example 19 | SUS316L | 1.5 | 1.5 | 0.3 | 0.3 | 1 | Solvent C | 10,000 |
| Example 19-2 | SUS316L | 1.5 | 1.5 | 0.3 | 0.3 | 1 | Solvent C | 10,000 |
| Example 20 | SUS316L | 1.5 | 1.5 | 0.3 | 0.3 | 1 | Solvent D | 10,000 |
| Example 21 | SUS316L | 1.5 | 1.5 | 0.3 | 0.3 | 1 | Solvent E | 10,000 |
| Example 22 | SUS316L | 1.5 | 1.5 | 0.3 | 0.3 | 1 | Solvent F | 10,000 |
| Example 23 | SUS316L | 1.5 | 1.5 | 0.3 | 0.3 | 1 | Solvent G | 10,000 |
| Example 24 | SUS316L | 1.5 | 1.5 | 0.3 | 0.3 | 1 | Solvent H | 10,000 |
| Example 25 | SUS316L | 1.5 | 1.5 | 0.3 | 0.3 | 1 | Alkaline liquid | 10,000 |
| Example 26 | SUS304 | 1.3 | 1.9 | 0.3 | 0.3 | 3 | Solvent A | 10,000 |
| Example 27 | SUS316 | 1.4 | 1.4 | 0.3 | 0.3 | 3 | Solvent A | 10,000 |
| Example 28 | SUS316L | 1.5 | 1.5 | 0.3 | 0.3 | 0.2 | Solvent A | 10,000 |
| Example 29 | SUS316L | 1.5 | 1.5 | 0.3 | 0.3 | 0.08 | Solvent A | 10,000 |
| Comparative Example 01 | SUS316L | 3.1 | 4.3 | 1.2 | 0.3 | 3 | Solvent A | 10,000 |
| Comparative Example 02 | SUS316L | 0.5 | 0.5 | 0.3 | 0.3 | 30 | Solvent A | 10,000 |
| Comparative Example 03 | SUS316L | 0.4 | 0.4 | 0.3 | 0.3 | 10 | Solvent A | 10,000 |
| Comparative Example 04 | SUS316L | 0.4 | 0.4 | 0.3 | 0.3 | 10 | Solvent B | 10,000 |
| Comparative Example 05 | SUS316L | 0.4 | 0.4 | 0.3 | 0.3 | 10 | Solvent C | 10,000 |

TABLE 2-continued

| | Container | | | | | | Chemical liquid | |
|---|---|---|---|---|---|---|---|---|
| | | Cr/Fe ratio | | | | | | |
| | Base material | Surface | Maximum value at a depth equal to or smaller than 3 nm | Maximum value at a depth greater than 3 nm and equal to or smaller than 10 nm | Base material (depth 10 nm) | Average surface roughness Ra [nm] | Type of liquid | Content of high-boiling-point component |
| Comparative Example 06 | SUS316L | 0.4 | 0.4 | 0.3 | 0.3 | 10 | Solvent D | 10,000 |
| Comparative Example 07 | SUS316L | 0.4 | 0.4 | 0.3 | 0.3 | 10 | Solvent E | 10,000 |
| Comparative Example 08 | SUS316L | 0.4 | 0.4 | 0.3 | 0.3 | 10 | Solvent F | 10,000 |
| Comparative Example 09 | SUS316L | 0.4 | 0.4 | 0.3 | 0.3 | 10 | Solvent G | 10,000 |
| Comparative Example 10 | SUS316L | 0.4 | 0.4 | 0.3 | 0.3 | 10 | Solvent H | 10,000 |
| Comparative Example 11 | SUS316L | 0.4 | 0.4 | 0.3 | 0.3 | 10 | Alkaline liquid | 10,000 |
| Comparative Example 12 | SUS316L | 0.4 | 0.5 | 0.7 | 0.3 | 10 | Solvent A | 10,000 |

TABLE 3

| | Change in content of metal component | Defect inhibition properties | | | |
|---|---|---|---|---|---|
| | | | | Bridge defect | |
| | | Residue defect | Stain-like defect | Evaluation | Process |
| Example 01 | B | B | A | B | Pre-wetting |
| Example 02 | B | B | A | A | Pre-wetting |
| Example 03 | A | A | A | A | Pre-wetting |
| Example 04 | A | A | A | A | Pre-wetting |
| Example 05 | A | B | B | B | Pre-wetting |
| Example 06 | A | C | C | C | Pre-wetting |
| Example 07 | B | B | A | A | Pre-wetting |
| Example 08 | A | A | A | A | Pre-wetting |
| Example 09 | A | A | A | A | Pre-wetting |
| Example 10 | A | A | A | A | Pre-wetting |
| Example 11 | B | B | A | B | Pre-wetting |
| Example 12 | B | B | A | B | Pre-wetting |
| Example 13 | B | B | A | B | Pre-wetting |
| Example 14 | C | B | A | B | Pre-wetting |
| Example 15 | C | B | A | B | Pre-wetting |
| Example 16 | C | C | A | C | Pre-wetting |
| Example 17 | B | B | A | C | Pre-wetting |
| Example 18 | A | A | A | A | Pre-wetting |
| Example 19 | A | A | A | A | Rinsing |
| Example 19-2 | A | A | A | A | Development |
| Example 20 | A | A | A | A | Pre-wetting |
| Example 21 | A | A | A | A | Rinsing |
| Example 22 | A | A | A | A | Rinsing |
| Example 23 | A | A | A | A | Rinsing |
| Example 24 | A | A | A | A | Pre-wetting |
| Example 25 | B | A | A | A | Development |
| Example 26 | A | A | A | A | Pre-wetting |
| Example 27 | A | A | A | A | Pre-wetting |
| Example 28 | A | A | A | A | Pre-wetting |
| Example 29 | C | C | A | B | Pre-wetting |
| Comparative Example 01 | D | D | A | D | Pre-wetting |
| Comparative Example 02 | E | E | B | D | Pre-wetting |
| Comparative Example 03 | D | D | B | D | Pre-wetting |
| Comparative Example 04 | D | D | B | D | Pre-wetting |
| Comparative Example 05 | D | D | B | D | Rinsing |

TABLE 3-continued

| | Change in content of metal component | Defect inhibition properties | | | |
|---|---|---|---|---|---|
| | | | | Bridge defect | |
| | | Residue defect | Stain-like defect | Evaluation | Process |
| Comparative Example 06 | D | D | B | D | Pre-wetting |
| Comparative Example 07 | D | D | B | D | Rinsing |
| Comparative Example 08 | D | D | B | D | Rinsing |
| Comparative Example 09 | D | D | B | D | Rinsing |
| Comparative Example 10 | D | D | B | D | Pre-wetting |
| Comparative Example 11 | D | D | B | D | Development |
| Comparative Example 12 | D | D | B | D | Pre-wetting |

From the results shown in Table 3, it has been confirmed that the effects of the present invention are further improved by the chemical liquid storage body according to an embodiment of the present invention.

Furthermore, it has been confirmed that in a case where the average surface roughness of the container is equal to or higher than 0.1 nm, the defect inhibition properties of the chemical liquid tend to be further improved (comparison between Examples 28 and 29, and the like.).

It has been confirmed that in a case where Cr/Fe within the surface of the container is 1.1 to 2.5, the effects of the present invention tend to be further improved (results of Examples 08 to 10, 18 to 24, and 26 to 28, and the like).

It has been confirmed that in a case where the electropolished member is used for the surface of the container, the effects of the present invention tend to be further improved (comparison between Examples 09 and 15, and the like).

It has been confirmed that in a case where the member having undergone a pre-treatment in addition to the electropolishing is used, the effects of the present invention tend to be further improved (comparison between Examples 16 and 17, and the like).

It has been confirmed that in a case where the content of the high-boiling-point organic component in the chemical liquid is 0.1 to 100,000 mass ppt (preferably 0.1 to 20,000 mass ppt), the effects of the present invention are further improved (comparison of Examples 02 to 06, and the like).

Example Y

[Manufacturing Device]

A chemical liquid was manufactured using a chemical liquid manufacturing device including a reactor, a distillation column, a filter unit, a storage tank, and a pipe line formed of a member having undergone the same surface treatment as that performed on the container of Example 02 or Comparative Example 03 in Example X described above. That is, the surface characteristics (Cr/Fe ratio and the like) of the reactor, distillation column, filter unit, storage tank, and pipe line were the same as the surface characteristics of the container of Example 02 or Comparative Example 03. The manufactured chemical liquid was stored in a container using a member having undergone the same surface treatment as that performed on the container of Example 02 or Comparative Example 03 in Example X.

In manufacturing the chemical liquid, circulation filtration was not performed. Furthermore, the aforementioned manufacturing device also included a filling device. In all the test, the filling device used was formed of a member having undergone the same surface treatment as that performed on the container of Example 02 in Example X.

The manufacturing device comprises the reactor, the distillation column, the filter unit, the storage tank, and the filling device that are arranged in this order from the primary side, and these members are connected in series by the pipe line.

Here, in a case where a chemical liquid to be manufactured was a mixture of two kinds of organic solvents, the organic solvents were separately manufactured until they were filled into the storage tank. The organic solvents that were separately manufactured and stored in the storage tank were made into a mixed solution by being filled into a tank (also called "mixing tank") provided between the storage tank and the filling device at a desired mass ratio. Thereafter, just as other chemical liquids, the mixed solution (chemical liquid) was filled into a container through the filling device.

That is, in the manufacturing device used in a case where a chemical liquid to be manufactured is a mixture of two kinds of organic solvents, a pair of constitutions each of which includes "reactor, distillation column, filter unit, and storage tank" connected in series is arranged in parallel and joined together in the mixing tank. The mixing tank is also connected to the filling device, and hence the mixed solution (chemical liquid) can be filled into a container.

The mixing tank is a form of storage tank, and is formed of a member that has undergone the same surface treatment as that performed on the container of Example 02.

Furthermore, the used filter unit was prepared by installing an ion exchange filter manufactured by Pall Corporation Japan in a filter housing that had undergone the same surface treatment as that performed on the container of Example 02 or Comparative Example 03.

Table 4 shows the constitution of the manufacturing device.

The following chemical liquids were manufactured.

A: propylene glycol monomethyl ether acetate (PGMEA)

B: PGMEA/PGME=7:3 (mixed solution of propylene glycol monomethyl ether acetate/propylene glycol monomethyl ether=7/3 (mass ratio))

C: Butyl acetate (nBA)

D: Cyclohexanone

E: Isopropanol (IPA)

F: MIBC (4-methyl-2-pentanol)

G: Ethyl lactate

H: PGMEA/PC=9:1 (mixed solution of propylene glycol monomethyl ether acetate/propylene carbonate=9/1 (mass ratio))

Alkaline liquid: 2.38% by mass aqueous tetramethylammonium hydroxide (TMAH)

Solution

In addition, each of the chemical liquids was manufactured as follows.

A (PGMEA):

Propylene oxide, methanol, and acetic acid were reacted with one other in the presence of sulfuric acid.

B (PGMEA/PGME=7:3):

PGMEA was manufactured by reacting propylene oxide, methanol, and acetic acid in the presence of sulfuric acid. In addition, PGME was manufactured by reacting propylene oxide with methanol in the presence of sulfuric acid.

C(nBA):

Acetic acid was reacted with n-butanol in the presence of sulfuric acid.

D (cyclohexanone):

Cyclohexane was subjected to an oxidation reaction in the presence of cobalt.

E (IPA):

Acetone was reacted with hydrogen in the presence of copper oxide-zinc oxide-aluminum oxide.

F (MIBC):

Cis-4-methyl-2-pentene was reacted in the presence of diisopinocampheylborane (Ipc2BH).

G (Ethyl Lactate):

Lactic acid was reacted with ethanol.

H (PGMEA/PC=9:1):

PGMEA was manufactured by reacting propylene oxide, methanol, and acetic acid in the presence of sulfuric acid. Furthermore, PC was manufactured by reacting propylene oxide with carbon dioxide.

In manufacturing an alkaline liquid, the reactor and the distillation column were not used. The alkaline liquid was manufactured by dissolving tetramethylammonium hydroxide (TMAH) in pure water, passed through the filter unit, the storage tank, and the filling device in this order, and filled into a container.

[Test]

By using the chemical liquid that had been stored for 3 days in an environment at 23° C. after being filled into the container, the following evaluation was performed.

<Content of High-Boiling-Point Organic Component>

The content of a high-boiling-point organic component in the manufactured chemical liquid was measured by gas chromatography mass spectrometry (GC/MS).

<Content of Metal Component>

The content of the specific metal component in the manufactured chemical liquid was measured using ICP-MS, and evaluated based on the following standard.

A: The content of the specific metal component in the chemical liquid was equal to or smaller than 10 mass ppt.

B: The content of the specific metal component in the chemical liquid was greater than 10 mass ppt and equal to or smaller than 30 mass ppt.

C: The content of the specific metal component in the chemical liquid was greater than 30 mass ppt and equal to or smaller than 100 mass ppt.

D: The content of the specific metal component in the chemical liquid was greater than 100 mass ppt and equal to or smaller than 500 mass ppt.

E: The content of the specific metal component in the chemical liquid was greater than 500 mass ppt.

<Evaluation of Defect Inhibition Properties of Chemical Liquid>

The defect inhibition properties of the manufactured chemical liquid were evaluated by the same method and standard as those in Example X.

<Evaluation of Service Life of Filter (Service Life of Ion Exchange Filter)>

Chemical liquids were continuously manufactured using each of the manufacturing devices described in Table 4. After the manufacturing of a chemical liquids was started and the state of the manufacturing devices was stabilized, the obtained chemical liquid was immediately collected for test (initial sample). Then, whenever the amount of the filtered liquid reached 10,000 kg, the obtained chemical liquid was collected for test (sample collected over time). Each of the chemical liquids collected for test was evaluated by the method for evaluating the residue defect inhibition properties of a chemical liquid described above and compared with the initial sample in terms of the number of defects per unit area, and the amount of the filtered liquid at a point in time when the number of defects of the sample collected over time doubled was regarded as "service life" of the filter (ion exchange filter). The service life obtained using the manufacturing device of comparative examples was regarded as 1, and the service life of the filter of the manufacturing device in each example manufacturing the same type of chemical liquid was evaluated based on the ratio the above service life to 1. The results were evaluated according to the following standard.

A: The service life was longer than 10.

B: The service life was longer than 5 and equal to or shorter than 10.

C: The service life was longer than 2 and equal to or shorter than 5.

D: The service life was longer than 1 and equal to or shorter than 2.

E: The service life was equal to or shorter than 1.

-: Comparative example for comparison

Table 4 shows the constitution of each manufacturing device, and Table 5 shows the test results.

In Table 4, the description of "Example 2" or "Comparative Example 3" shows that each constituent of the manufacturing device or the container is formed of the member having undergone the same surface treatment as that performed on the container of Example 02 in Example X or formed of the member having undergone the same surface treatment as that performed on the container of Comparative Example 03.

TABLE 4

| | Manufacturing device | | | | | |
|---|---|---|---|---|---|---|
| | Reactor | Distillation column | Filter unit | Storage tank | Pipe line | Container |
| Example B01 | Example 2 | Example 2 | Example 2 | Example 2 | Example 2 | Example 2 |
| Example B02 | Example 2 | Example 2 | Example 2 | Example 2 | Example 2 | Example 2 |
| Example B03 | Example 2 | Example 2 | Example 2 | Example 2 | Example 2 | Example 2 |
| Example B04 | Example 2 | Example 2 | Example 2 | Example 2 | Example 2 | Example 2 |
| Example B05 | Example 2 | Example 2 | Example 2 | Example 2 | Example 2 | Example 2 |
| Example B06 | Example 2 | Example 2 | Example 2 | Example 2 | Example 2 | Example 2 |
| Example B07 | Example 2 | Example 2 | Example 2 | Example 2 | Example 2 | Example 2 |
| Example B08 | Example 2 | Example 2 | Example 2 | Example 2 | Example 2 | Example 2 |
| Example B09 | | | Example 2 | Example 2 | Example 2 | Example 2 |
| Example B10 | Comparative Example 3 | Example 2 | Example 2 | Example 2 | Example 2 | Example 2 |
| Example B11 | Example 2 | Comparative Example 3 | Example 2 | Example 2 | Example 2 | Example 2 |
| Example B12 | Example 2 | Example 2 | Comparative Example 3 | Example 2 | Example 2 | Example 2 |
| Example B13 | Example 2 | Example 2 | Example 2 | Comparative Example 3 | Example 2 | Example 2 |
| Example B14 | Example 2 | Example 2 | Example 2 | Example 2 | Comparative Example 3 | Example 2 |
| Example B15 | Example 2 | Example 2 | Example 2 | Example 2 | Example 2 | Comparative Example 3 |
| Comparative Example B01 | Comparative Example 3 | Comparative Example 3 | Comparative Example 3 | Comparative Example 3 | Comparative Example 3 | Comparative Example 3 |
| Comparative Example B02 | Comparative Example 3 | Comparative Example 3 | Comparative Example 3 | Comparative Example 3 | Comparative Example 3 | Comparative Example 3 |
| Comparative Example B03 | Comparative Example 3 | Comparative Example 3 | Comparative Example 3 | Comparative Example 3 | Comparative Example 3 | Comparative Example 3 |
| Comparative Example B04 | Comparative Example 3 | Comparative Example 3 | Comparative Example 3 | Comparative Example 3 | Comparative Example 3 | Comparative Example 3 |
| Comparative Example B05 | Comparative Example 3 | Comparative Example 3 | Comparative Example 3 | Comparative Example 3 | Comparative Example 3 | Comparative Example 3 |
| Comparative Example B06 | Comparative Example 3 | Comparative Example 3 | Comparative Example 3 | Comparative Example 3 | Comparative Example 3 | Comparative Example 3 |
| Comparative Example B07 | Comparative Example 3 | Comparative Example 3 | Comparative Example 3 | Comparative Example 3 | Comparative Example 3 | Comparative Example 3 |

TABLE 4-continued

| | Manufacturing device | | | | | |
|---|---|---|---|---|---|---|
| | Reactor | Distillation column | Filter unit | Storage tank | Pipe line | Container |
| Comparative Example B08 | Comparative Example 3 | Comparative Example 3 | Comparative Example 3 | Comparative Example 3 | Comparative Example 3 | Comparative Example 3 |
| Comparative Example B09 | | | Comparative Example 3 | Comparative Example 3 | Comparative Example 3 | Comparative Example 3 |

TABLE 5

| | Manuafctured chemical liquid | | | Defect inhibition properties | | | | Service life of ion exchange filter |
|---|---|---|---|---|---|---|---|---|
| | Type of liquid | Content of metal component [mass ppt] | High-boiling-point component [mass ppt] | Residue defect | Stain-like defect | Bridge defect Evaluation | Process | |
| Example B01 | A | A | 10,000 | A | A | A | Pre-wetting | A |
| Example B02 | B | B | 10,000 | A | A | A | Pre-wetting | A |
| Example B03 | C | A | 10,000 | A | A | A | Rinsing | A |
| Example B04 | D | A | 10,000 | A | A | A | Pre-wetting | A |
| Example B05 | E | A | 10,000 | A | A | A | Rinsing | A |
| Example B06 | F | A | 10,000 | A | A | A | Rinsing | A |
| Example B07 | G | A | 10,000 | A | A | A | Rinsing | A |
| Example B08 | H | A | 10,000 | A | A | A | Pre-wetting | A |
| Example B09 | Alkaline liquid | A | 10,000 | A | A | A | Development | A |
| Example B10 | A | C | 10,000 | B | B | B | Pre-wetting | D |
| Example B11 | A | C | 10,000 | C | B | B | Pre-wetting | D |
| Example B12 | A | D | 10,000 | C | B | C | Pre-wetting | D |
| Example B13 | A | D | 10,000 | C | B | C | Pre-wetting | A |
| Example B14 | A | D | 10,000 | C | B | C | Pre-wetting | B |
| Example B15 | A | D | 10,000 | C | B | C | Pre-wetting | A |
| Comparative Example B01 | A | E | 30,000 | E | C | E | Pre-wetting | — |
| Comparative Example B02 | B | E | 30,000 | E | C | E | Pre-wetting | — |
| Comparative Example B03 | C | E | 30,000 | E | C | E | Rinsing | — |
| Comparative Example B04 | D | E | 30,000 | E | C | E | Pre-wetting | — |
| Comparative Example B05 | E | E | 30,000 | E | C | E | Rinsing | — |
| Comparative Example B06 | F | E | 30,000 | E | C | E | Rinsing | — |
| Comparative Example B07 | G | E | 30,000 | E | C | E | Rinsing | — |
| Comparative Example B08 | H | E | 30,000 | E | C | E | Pre-wetting | — |
| Comparative Example B09 | Alkaline liquid | E | 30,000 | E | C | E | Development | — |

From the results shown in Table 5, it has been confirmed that according to the chemical liquid manufacturing method of an embodiment of the present invention, a chemical liquid having further improved residue defect inhibition properties and bridge defect inhibition properties is obtained. Furthermore, it has been confirmed that in a case where filtration is performed in the manufacturing process, the service life of the filter used can be prolonged.

Example Z

A container formed of SUS316L or a copolymer of tetrafluoroethylene and perfluoroalkoxyethylene (PFA) was subjected to a surface treatment under the conditions shown in Table 6.

Table 7 shows the surface structure of each container having undergone the treatment and the chemical liquid stored in the container.

Unless otherwise specified, among the following treatments for test, the treatment identical to the treatment described above was performed according to the same procedure as that adopted for the treatment descried above.

Furthermore, unless otherwise specified, among the descriptions in the following table, the description identical to the description in the above table has the same definition as the description in the above table.

TABLE 6

| | Base material | Surface treatment method: Pre-treatment | Electropolishing: Liquid temperature ° C. | Current density A/dm$^2$ | Treatment time min | Post-treatment 1 | Post-treatment 2 |
|---|---|---|---|---|---|---|---|
| Example 201 | SUS316L | Buffing with #400 abrasive | 50 | 10 | 60 | Annealing | Acid treatment |
| Example 202 | SUS316L | Buffing with #400 abrasive | 50 | 10 | 60 | Annealing | Acid treatment |
| Example 203 | SUS316L | Buffing with #400 abrasive | 50 | 10 | 60 | Annealing | Acid treatment |
| Example 204 | SUS316L | Buffing with #400 abrasive | 50 | 10 | 60 | Annealing | Acid treatment |
| Example 205 | SUS316L | Buffing with #400 abrasive | 50 | 10 | 60 | Annealing | Acid treatment |
| Example 206 | SUS316L | Buffing with #400 abrasive | 50 | 10 | 60 | Annealing | Acid treatment |
| Comparative Example 301 | SUS316L | Buffing with #400 abrasive | | N/A | | N/A | N/A |
| Comparative Example 302 | PFA | N/A | | N/A | | N/A | N/A |
| Example 207 | SUS316L | Buffing with #400 abrasive | 50 | 10 | 60 | Annealing | Acid treatment |
| Example 208 | SUS316L | Buffing with #400 abrasive | 50 | 10 | 60 | Annealing | Acid treatment |
| Example 209 | SUS316L | Buffing with #400 abrasive | 50 | 10 | 60 | Annealing | Acid treatment |
| Example 210 | SUS316L | Buffing with #400 abrasive | 50 | 10 | 60 | Annealing | Acid treatment |
| Example 211 | SUS316L | Buffing with #400 abrasive | 50 | 10 | 60 | Annealing | Acid treatment |
| Example 212 | SUS316L | Buffing with #400 abrasive | 50 | 10 | 60 | Annealing | Acid treatment |
| Example 213 | SUS316L | Buffing with #400 abrasive | 50 | 10 | 60 | Annealing | Acid treatment |
| Example 214 | SUS316L | Buffing with #400 abrasive | 50 | 10 | 60 | Annealing | Acid treatment |
| Example 215 | SUS316L | Buffing with #400 abrasive | 50 | 10 | 60 | Annealing | Acid treatment |
| Example 216 | SUS316L | Buffing with #400 abrasive | 50 | 10 | 60 | Annealing | Acid treatment |
| Example 217 | SUS316L | Buffing with #400 abrasive | 50 | 10 | 60 | Annealing | Acid treatment |

TABLE 7

| | Container: Base material | Cr/Fe ratio: Surface | Maximum value at depth equal to or smaller than 3 nm | Maximum value at depth greater than 3 nm and equal to or smaller than 10 nm | Base material (depth 10 nm) | Average surface roughness Ra [nm] |
|---|---|---|---|---|---|---|
| Example 201 | SUS316L | 1.5 | 1.5 | 0.3 | 0.3 | 2 |
| Example 202 | SUS316L | 1.5 | 1.5 | 0.3 | 0.3 | 2 |
| Example 203 | SUS316L | 1.5 | 1.5 | 0.3 | 0.3 | 2 |
| Example 204 | SUS316L | 1.5 | 1.5 | 0.3 | 0.3 | 2 |
| Example 205 | SUS316L | 1.5 | 1.5 | 0.3 | 0.3 | 2 |
| Example 206 | SUS316L | 1.5 | 1.5 | 0.3 | 0.3 | 2 |
| Comparative Example 301 | SUS316L | 0.4 | 0.4 | 0.3 | 0.3 | 10 |
| Comparative Example 302 | PFA | — | — | — | — | 40 |
| Example 207 | SUS316L | 1.5 | 1.5 | 0.3 | 0.3 | 2 |
| Example 208 | SUS316L | 1.5 | 1.5 | 0.3 | 0.3 | 2 |
| Example 209 | SUS316L | 1.5 | 1.5 | 0.3 | 0.3 | 2 |
| Example 210 | SUS316L | 1.5 | 1.5 | 0.3 | 0.3 | 2 |
| Example 211 | SUS316L | 1.5 | 1.5 | 0.3 | 0.3 | 2 |
| Example 212 | SUS316L | 1.5 | 1.5 | 0.3 | 0.3 | 2 |
| Example 213 | SUS316L | 1.5 | 1.5 | 0.3 | 0.3 | 2 |
| Example 214 | SUS316L | 1.5 | 1.5 | 0.3 | 0.3 | 2 |
| Example 215 | SUS316L | 1.5 | 1.5 | 0.3 | 0.3 | 2 |
| Example 216 | SUS316L | 1.5 | 1.5 | 0.3 | 0.3 | 2 |
| Example 217 | SUS316L | 1.5 | 1.5 | 0.3 | 0.3 | 2 |

Table 8 shows the type of the chemical liquid stored in the container of each test example and the gas filled into the void portion of the container. The void fraction of the container in the chemical liquid storage body was 20% by volume.

In the table, the abbreviation for each solvent means the following.

Furthermore, the content of the high-boiling-point organic component in each chemical liquid (content with respect to the total mass of the chemical liquid) was adjusted to the content (mass ppt) described in the table that will be shown later.

A: propylene glycol monomethyl ether acetate (PGMEA)

B: PGMEA/PGME=7:3 (mixed solution of propylene glycol monomethyl ether acetate/propylene glycol monomethyl ether=7/3 (mass ratio))

C: Butyl acetate (nBA)

D: Cyclohexanone

E: Isopropanol (IPA)

F: MIBC (4-methyl-2-pentanol)

G: Ethyl lactate

I: Undecane

J: Mixed solution of dimethyl malonate/isoamyl ether=9/1 (mass ratio)

K: Mixed solution of dimethyl malonate/isoamyl ether=5/5 (mass ratio)

L: Mixed solution of dimethyl malonate/isoamyl ether=1/9 (mass ratio)

M: Dimethyl malonate

Pure PGMEA has a Hansen solubility parameter distance of 9.5 $MPa^{0.5}$ to eicosene.

Pure PGME has a Hansen solubility parameter distance of 11.0 $MPa^{0.5}$ to eicosene.

Pure dimethyl malonate has a Hansen solubility parameter distance of 10.3 $MPa^{0.5}$ to eicosene.

Pure isoamyl ether has a Hansen solubility parameter distance of 2.1 $MPa^{0.5}$ to eicosene.

In the table, the column of "Volume resistance value" shows the volume resistivity (Ωm) of a chemical liquid. The volume resistivity was measured by the method described in the present specification.

The column of "HSP distance to eicosene" shows the Hansen solubility parameter distance of a chemical liquid to eicosene. In a case where a chemical liquid contains two kinds of solvents, the value in the column of "HSP distance to eicosene" of a chemical liquid shown in the table is a weighted average of Hansen solubility parameters based on the molar ratio of the content of the solvents.

The column of "Type of gas" shows the type of inert gas filled into the void portion of the chemical liquid storage body.

The column of "vol %" shows the purity of the inert gas.

TABLE 8

| | Chemical liquid | | | | Void portion | |
|---|---|---|---|---|---|---|
| | Type of liquid | Volume resistance value | Content of high-boiling-point component | HSP distance to eicosene | Type of gas | vol % |
| Example 201 | Solvent C | 1,100,000,000 | 10,000 | 5.6 | $N_2$ | 99.9 |
| Example 202 | Solvent C | 1,100,000,000 | 10,000 | 5.6 | $N_2$ | >99.9999 |
| Example 203 | Solvent C | 1,100,000,000 | 10,000 | 5.6 | $N_2$ | 95 |
| Example 204 | Solvent C | 1,100,000,000 | 10,000 | 5.6 | Ar | 95 |
| Example 205 | Solvent C | 1,100,000,000 | 10,000 | 5.6 | Xe | 95 |
| Example 206 | Solvent C | 1,100,000,000 | 10,000 | 5.6 | Atmosphere | — |
| Comparative Example 301 | Solvent C | 1,100,000,000 | 10,000 | 5.6 | $N_2$ | 95 |
| Comparative Example 302 | Solvent C | 1,100,000,000 | 10,000 | 5.6 | $N_2$ | 95 |
| Example 207 | Solvent A | 170,000,000 | 5,000 | 9.5 | $N_2$ | 95 |
| Example 208 | Solvent B | 3,200,000 | 5,000 | 11.0 | $N_2$ | 95 |
| Example 209 | Solvent D | 25,000,000 | 8,000 | 9.1 | $N_2$ | 95 |
| Example 210 | Solvent E | 12,000,000 | 12,000 | 15.8 | $N_2$ | 95 |
| Example 211 | Solvent F | 22,000,000 | 15,000 | 11.1 | $N_2$ | 95 |
| Example 212 | Solvent G | 400,000 | 15,000 | 12.9 | $N_2$ | 95 |
| Example 213 | Solvent I | 80,000,000,000,000 | 12,000 | 1.8 | $N_2$ | 95 |
| Example 214 | Solvent J | 5,300,000 | 14,000 | 9.4 | $N_2$ | 95 |
| Example 215 | Solvent K | 55,000,000 | 13,000 | 5.9 | $N_2$ | 95 |
| Example 216 | Solvent L | 180,000,000 | 11,000 | 2.7 | $N_2$ | 95 |
| Example 217 | Solvent M | 4,700,000 | 15,000 | 10.3 | $N_2$ | 95 |

<Evaluation of Charge Potential>

Each container was filled with each chemical liquid and then stored for 12 months in an environment at 40° C. Then, the charge potential of the chemical liquid was measured by the same method as that described in the present specification.

<Change in Content of Metal Component>

Based on the same method and standard as those described in Example X, the change in the metal content was evaluated.

<Evaluation of Defect Inhibition Properties of Chemical Liquid>

By using the chemical liquid that had been stored for 12 months in an environment at 40° C. after being filled into the container, the following evaluation was performed.

(Residue Defect Inhibition Properties and Stain-Like Defect Inhibition Properties)

Based on the same method and standard as those described in Example X, residue defect inhibition properties and stain-like defect inhibition properties were evaluated.

(Metal-Containing Residue Defect Inhibition Properties)

The metal-containing residue defect inhibition properties of chemical liquids were evaluated by the following method. A coater developer "RF$^{3S}$" manufactured by Sokudo Co., Ltd. was used for test.

The chemical liquid that had been stored for 12 months in an environment at 40° C. after being filled into the container was returned to room temperature (23° C.), and a silicon wafer having a diameter of 300 mm was spin-coated with the chemical liquid. The silicon wafer was dried, and then the positions of increased defects were specified using a wafer surface foreign substance inspection device SP-5 manufactured by KLA-Tencor Corporation. By using a review SEM manufactured by Applied Materials, Inc., each of the increased defects was analyzed to check whether or not the defects contain Fe, Cr, and/or Ni. Among the increased defects, a defect containing Fe, Cr, and/or Ni was defined as a metal-containing residue defect, and the metal-containing residue defect inhibition properties of the chemical liquid were evaluated based on the following standard.

A: The number of metal-containing residue defects increased was equal to or smaller than 0/wafer.

B: The number of metal-containing residue defects increased was equal to or greater than 1/wafer and equal to or smaller than 5/wafer.

C: The number of metal-containing residue defects increased was equal to or greater than 6/wafer and equal to or smaller than 50/wafer.

D: The number of metal-containing residue defects increased was equal to or greater 51/wafer.

(Bridge Defect Inhibition Properties)

By the following method, the bridge defect inhibition performance of chemical liquids were evaluated.

First, a resist composition having the following formulation was prepared.

Resist Composition

The resist composition was obtained by mixing together components at the following compositional ratio.

Resin (A-1): 0.77 g

Photoacid generator (B-1): 0.03 g

Basic compound (E-3): 0.03 g

PGMEA (commercial product, distilled and purified high-purity grade solvent): 67.5 g Ethyl lactate (commercial product, distilled and purified high-purity grade solvent): 75 g Resin As a resin, the following resin was used.

Photo-Acid Generator

As a photo-acid generator, the following compound was used.

(B-1)

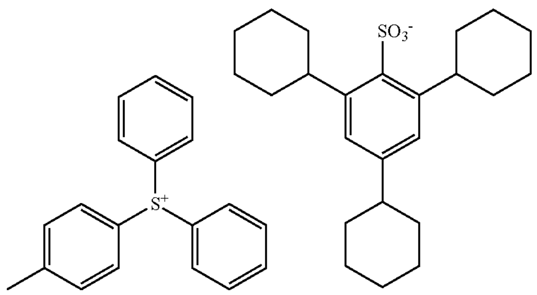

Basic Compound

As a basic compound, the following compound was used.

(E-3)

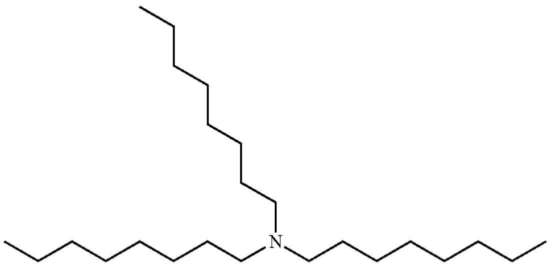

Next, a silicon wafer having a diameter of 300 mm was coated with AL412 (manufactured by Brewer Science, Inc.) and baked at 200° C. for 60 seconds, thereby forming a resist underlayer film having a film thickness of 20 nm. The resist underlayer film was coated with a prewet solution (obtained by purifying PGMEA as a commercial product (high-purity grade) by distillation), then coated with the resist composition, and baked at 100° C. for 60 seconds (PB: Prebake), thereby forming a resist film having a film thickness of 30 nm.

By using an EUV exposure machine (manufactured by ASML; NXE3350, NA 0.33, Dipole 90°, outer sigma 0.87, inner sigma 0.35), this resist film was exposed through a reflective mask. Then, the resist film was baked at 85° C. for

| Resin | | Compositional ratio (molar ratio) from left | Mw | Mw/Mn |
|---|---|---|---|---|
| A-1 | 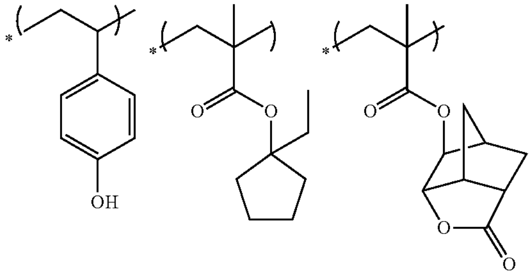 | 30/60/10 | 11,200 | 1.45 |

60 second (PEB:Post Exposure Bake). Thereafter, a developer (obtained by purifying commercial butyl acetate by distillation (high-purity grade)) was sprayed on the resist film for 30 seconds by a spraying method such that the resist was developed, and a rinsing solution was discharged onto the silicon wafer for 20 seconds by a spin coating method such that the wafer was rinsed. Subsequently, the silicon wafer was rotated at a rotation speed of 2,000 rpm for 40 seconds, thereby forming a line-and-space pattern having a space width of 20 nm and a pattern line width of 15 nm.

As the rinsing solution, each of the chemical liquids as evaluation targets was used.

During the discharge of the chemical liquid used as a rinsing solution, the chemical liquid was transferred from the container to a discharge port of a coating device or the like through piping (manufactured by NICHIAS Corporation/liquid contact portion made of PFA/φ: inner diameter of 4.35 m, outer diameter of 6.35 mm/length: 10 m/the piping was used after being preliminarily rinsed out with a washing solution obtained by purifying commercial PGMEA by distillation).

The above pattern was imaged, the obtained image was analyzed using the aforementioned analyzer, and the number of bridge defects per unit area was measured.

(Evaluation Standard for Bridge Defect Inhibition Properties)

A: The number of defects was equal to or smaller than 50/wafer.

B: The number of defects was equal to or greater than 51/wafer and equal to or smaller than 100/wafer.

C: The number of defects was equal to or greater than 101/wafer and equal to or smaller than 1,000/wafer.

D: The number of defects was equal to or greater than 1,001/wafer. The results are shown in Table 9.

The description of "<±2 kV" in the column of "Charge potential" in the table shows that the measured charge potential of the chemical liquid was within a range of −2 to 2 kV and was outside the range of ">±2 kV".

From the results shown in the table, it has been confirmed that in a case where the member according to an embodiment of the present invention is used, even though the member is brought into contact with a chemical liquid having a high volume resistivity, it is easy to maintain the charge potential of the chemical liquid coming into contact with the member within a range of −2 to 2 kV, and the risk resulting from the charging of the chemical liquid can be reduced.

It has been confirmed that in a case where the void portion of the chemical liquid storage body is filled with an inert gas, the metal-containing residue defect inhibition properties are further improved (result of Example 206 and the like).

Furthermore, it has been confirmed that the purity of the inert gas is preferably equal to or higher than 99.9% by volume, and more preferably higher than 99.9999% by volume (comparison of Examples 201, 202, and 203, and the like).

It has been confirmed that in a case where the chemical liquid as an organic solvent is an organic solvent having a Hansen solubility parameter distance of 3 to 20 $MPa^{0.5}$ to eicosene, the effects of the present invention are further improved (result of Example 213 and the like).

Furthermore, it has been confirmed that in a case where the chemical liquid contains an organic solvent which has a Hansen solubility parameter distance of 3 to 20 $MPa^{0.5}$ to eicosene and an organic solvent which has a Hansen solubility parameter distance not being in a range of 3 to 20 $MPa^{0.5}$ to eicosene, and the mixing ratio (mass ratio) between the organic solvents is 20/80 to 80/20, the effects of the present invention are further improved (comparison of Examples 214 to 216, and the like).

EXPLANATION OF REFERENCES

10, 20: container with lid
11, 52: container
12, 51: lid
13: mouth

TABLE 9

| | Charge potential | Change in content of metal component | Defect inhibition properties: Residue defect | Stain-like defect | Metal-containing residue defect | Formation of pattern: Bridge defect | Process |
|---|---|---|---|---|---|---|---|
| Example 201 | <±2 kV | A | A | A | B | A | Rinsing |
| Example 202 | <±2 kV | A | A | A | A | A | Rinsing |
| Example 203 | <±2 kV | A | A | A | B | A | Rinsing |
| Example 204 | <±2 kV | A | A | A | B | A | Rinsing |
| Example 205 | <±2 kV | A | A | A | B | A | Rinsing |
| Example 206 | <±2 kV | A | A | A | C | A | Rinsing |
| Comparative Example 301 | <±2 kV | D | D | B | D | D | Rinsing |
| Comparative Example 302 | >±2 kV | A | D | A | B | C | Rinsing |
| Example 207 | <±2 kV | A | A | A | B | A | Rinsing |
| Example 208 | <±2 kV | A | A | A | B | A | Rinsing |
| Example 209 | <±2 kV | A | A | A | B | A | Rinsing |
| Example 210 | <±2 kV | A | A | A | B | A | Rinsing |
| Example 211 | <±2 kV | A | A | A | B | A | Rinsing |
| Example 212 | <±2 kV | A | A | A | B | A | Rinsing |
| Example 213 | <±2 kV | A | A | A | B | C | Rinsing |
| Example 214 | <±2 kV | A | A | A | B | B | Rinsing |
| Example 215 | <±2 kV | A | A | A | B | A | Rinsing |
| Example 216 | <±2 kV | A | A | A | B | C | Rinsing |
| Example 217 | <±2 kV | A | A | A | B | A | Rinsing |

14: lateral portion
15: inner wall surface
16: outer wall surface
30, 70: purification device
31: storage tank
32: filter unit
33, 71, 72, 73: pipe line
34: filling device
35: pump
36, 37, 83; valve
40: filter
41: filter medium
42: core
43: cap
44: liquid outlet
50: housing
52: body
53: liquid inlet
54: liquid outlet
55, 56: internal pipe line
71: distillation column
80: manufacturing device
81: reactor
82: raw material inlet

What is claimed is:

1. A chemical liquid storage body comprising:

a container; and a chemical liquid stored in the container, wherein at least a part of a liquid contact portion of the container is formed of a member that will be brought into contact with the chemical liquid, wherein a surface of the member is constituted with stainless steel containing chromium atoms and iron atoms, an atomic ratio of the chromium atoms to the iron atoms is measured from the surface of the member to a position 10 nm below the surface along a depth direction, a maximum value of the atomic ratio is found in a region extending 3 nm from the surface in the depth direction, the maximum value is 0.5 to 3.0, an average surface roughness of the surface of the member is equal to or lower than 10 nm the atomic ratio of the chromium atoms to the iron atoms at a position 10 nm deep from the surface of the member is 0.3 to 0.6 and wherein the chemical liquid contains one or more kinds of compounds selected from the group consisting of propylene glycol monomethyl ether acetate, propylene glycol monomethyl ether, cyclohexanone, propylene carbonate, γ-butyrolactone, isoamyl acetate, propylene glycol monoethyl ether, ethyl lactate, methyl methoxypropionate, cyclopentanone, diisoamyl ether, dimethyl sulfoxide, N-methylpyrrolidone, ethylene carbonate, cycloheptanone, 2-heptanone, butyl butyrate, isobutyl isobutyrate, undecane, pentyl propionate, isopentyl propionate, ethylcyclohexane, mesitylene, ethyl acetoacetate, dimethyl malonate, methyl pyruvate, and dimethyl oxalate.

2. The chemical liquid storage body according to claim 1, wherein the average surface roughness is 0.10 to 10 nm.

3. The chemical liquid storage body according to claim 1, wherein the atomic ratio of the chromium atoms to the iron atoms within the surface of the member is 1.1 to 2.5.

4. The chemical liquid storage body according to claim 1, wherein the surface of the member is subjected to electropolishing.

5. The chemical liquid storage body according to claim 4, wherein the surface of the member is subjected to a surface treatment other than the electropolishing before the electropolishing.

6. The chemical liquid storage body according to claim 4, wherein the surface of the member is further subjected to an acid treatment after the electropolishing.

7. The chemical liquid storage body according to claim 1 that is used for at least one kind of purpose selected from the group consisting of manufacturing, storage, transport, and transfer of a chemical liquid for manufacturing semiconductors.

8. The chemical liquid storage body according to claim 7, wherein the chemical liquid has a volume resistivity equal to or higher than 500,000,000 Ωm.

9. The chemical liquid storage body according to claim 1, wherein the chemical liquid is a mixed solvent containing 20% to 80% by mass of an organic solvent having a Hansen solubility parameter distance of 3 to 20 $MPa^{0.5}$ to eicosene with respect to a total mass of the chemical liquid and 20% to 80% by mass of an organic solvent having a Hansen solubility parameter distance not being in a range of 3 to 20 $MPa^{0.5}$ to eicosene with respect to a total mass of the chemical liquid.

10. The chemical liquid storage body according to claim 1, wherein the chemical liquid has a volume resistivity equal to or higher than 500,000,000 Ωm.

11. The chemical liquid storage body according to claim 1, wherein the chemical liquid contains 0.1 to 100,000 mass ppt of a high-boiling-point organic component having a boiling point equal to or higher than 250° C. with respect to a mass of the chemical liquid.

12. The chemical liquid storage body according to claim 1, wherein a void portion in the container is filled with an inert gas.

13. The chemical liquid storage body according to claim 1, wherein the chemical liquid contains one or more kinds of compounds selected from the group consisting of propylene glycol monomethyl ether acetate, propylene carbonate, γ-butyrolactone, isoamyl acetate, propylene glycol monoethyl ether, propylene glycol monopropyl ether, ethyl lactate, methyl methoxypropionate, diisoamyl ether, dimethyl sulfoxide, N-methylpyrrolidone, ethylene carbonate, butyl butyrate, isobutyl isobutyrate, pentyl propionate, isopentyl propionate, ethyl acetoacetate, dimethyl malonate, methyl pyruvate, and dimethyl oxalate.

* * * * *